(12) United States Patent
Cai et al.

(10) Patent No.: US 12,176,921 B2
(45) Date of Patent: Dec. 24, 2024

(54) STORAGE DEVICE SYNDROME-WEIGHT-BASED ERROR CORRECTION SYSTEM

(71) Applicant: Dell Products L.P., Round Rock, TX (US)

(72) Inventors: Yuanzheng Cai, Shanghai (CN); Robert Proulx, Holden, MA (US); Frederick K. H. Lee, Mountain View, CA (US); Zhenwei Wang, Shanghai (CN)

(73) Assignee: Dell Products L.P., Round Rock, TX (US)

( * ) Notice: Subject to any disclaimer, the term of this patent is extended or adjusted under 35 U.S.C. 154(b) by 8 days.

(21) Appl. No.: 18/130,027

(22) Filed: Apr. 3, 2023

(65) Prior Publication Data

US 2024/0333310 A1    Oct. 3, 2024

(51) Int. Cl.
*H03M 13/15* (2006.01)
*H03M 13/00* (2006.01)
*H03M 13/11* (2006.01)

(52) U.S. Cl.
CPC ..... *H03M 13/159* (2013.01); *H03M 13/1108* (2013.01); *H03M 13/1111* (2013.01); *H03M 13/611* (2013.01)

(58) Field of Classification Search
CPC ........... H03M 13/159; H03M 13/1108; H03M 13/1111; H03M 13/611
USPC ......................................................... 714/785
See application file for complete search history.

(56) References Cited

U.S. PATENT DOCUMENTS

| | | | | |
|---|---|---|---|---|
| 8,495,479 | B1* | 7/2013 | Varnica | H03M 13/1111 714/780 |
| 9,274,891 | B2* | 3/2016 | Lin | G06F 11/1012 |
| 9,397,698 | B1 | 7/2016 | Burd et al. | |
| 2013/0229867 | A1* | 9/2013 | Tang | G06F 11/1068 365/185.2 |
| 2016/0112068 | A1* | 4/2016 | Kim | H03M 13/3715 714/755 |
| 2018/0373591 | A1* | 12/2018 | Barndt | G06F 11/1004 |

(Continued)

*Primary Examiner* — James C Kerveros
(74) *Attorney, Agent, or Firm* — Joseph Mencher

(57) ABSTRACT

A storage device syndrome-weight-based error correction system includes a syndrome-weight-based error correction subsystem that is coupled to a storage subsystem in a chassis. The syndrome-weight-based error correction subsystem performs a first error correction hard decoding operation on the storage subsystem that utilizes first read voltage thresholds and that generates a first final codeword candidate having a first syndrome weight. The syndrome-weight-based error correction subsystem then performs error correction hard decoding read voltage threshold real-time search operations to determine second read voltage thresholds, and performs a second error correction hard decoding operation on the storage subsystem that utilizes the second read voltage thresholds and that generates a second final codeword candidate having a second syndrome weight. If the syndrome-weight-based error correction subsystem determines that the first syndrome weight is less than the second syndrome weight, it performs error correction soft decoding operations using the first read voltage thresholds.

20 Claims, 21 Drawing Sheets

(56) References Cited

U.S. PATENT DOCUMENTS

2019/0149169 A1* 5/2019 Chang ................ H03M 13/1108
714/752

* cited by examiner

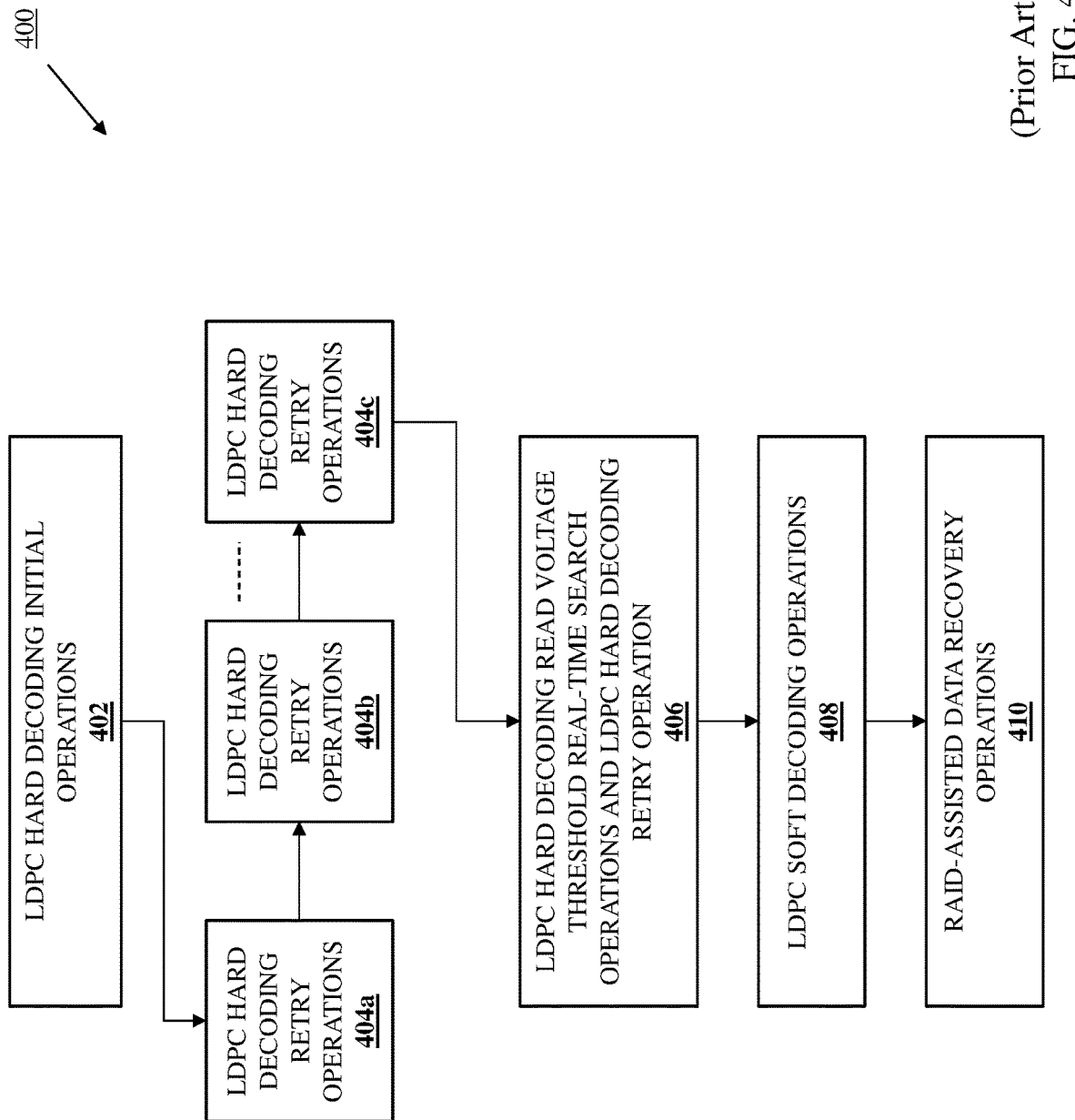

STORAGE DEVICE SYNDROME-WEIGHT-BASED ERROR CORRECTION SYSTEM

BACKGROUND

The present disclosure relates generally to information handling systems, and more particularly to correcting errors in storage devices used with information handling systems based on syndrome weights.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems utilize storage devices such as, for example, Solid State Drive (SSD) storage devices and/or other storage devices known in the art, in order to store their data. Furthermore, SSD storage devices perform error correction using Error Correction Code (ECC)) in order to increase the useful life of those SSD storage devices. For example, Low-Density Parity Check (LDPC) error correction using LDPC code is performed in many SSD storage devices, and operates by first attempting relatively faster "hard" decoding operations, then attempting relatively slower "soft" decoding operations when the hard decoding operations are unsuccessful, and finally using assisted data recovery techniques (e.g., Redundant Array of Independent Disk (RAID)-assisted data recovery techniques) if the soft decoding operations are unsuccessful. However, the inventors of the present disclosure have identified several inefficiencies in conventional LDPC error correction that operate in many situations to extend the time needed to perform error correction, interfere with operation of the SSD storage device, and result in other issues that would be apparent to one of skill in the art in possession of the present disclosure.

Accordingly, it would be desirable to provide a storage device error correction system that addresses the issues discussed above.

SUMMARY

According to one embodiment, an Information Handling System (IHS) includes a processing system; and a memory system that is coupled to the processing system and that includes instructions that, when executed by the processing system, cause the processing system to provide a syndrome-weight-based error correction engine that is configured to: perform, on a storage subsystem, a first error correction hard decoding operation that utilizes first read voltage thresholds and that generates a first final codeword candidate having a first syndrome weight; perform error correction hard decoding read voltage threshold real-time search operations to determine second read voltage thresholds; perform, on the storage subsystem, a second error correction hard decoding operation that utilizes the second read voltage thresholds and that generates a second final codeword candidate having a second syndrome weight; determine that the first syndrome weight is less than the second syndrome weight; and perform, on the storage subsystem in response to determining that the first syndrome weight is less than the second syndrome weight, error correction soft decoding operations using the first read voltage thresholds.

BRIEF DESCRIPTION OF THE DRAWINGS

FIG. 4 is a flow chart illustrating an embodiment of conventional storage device error correction stages is illustrated.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
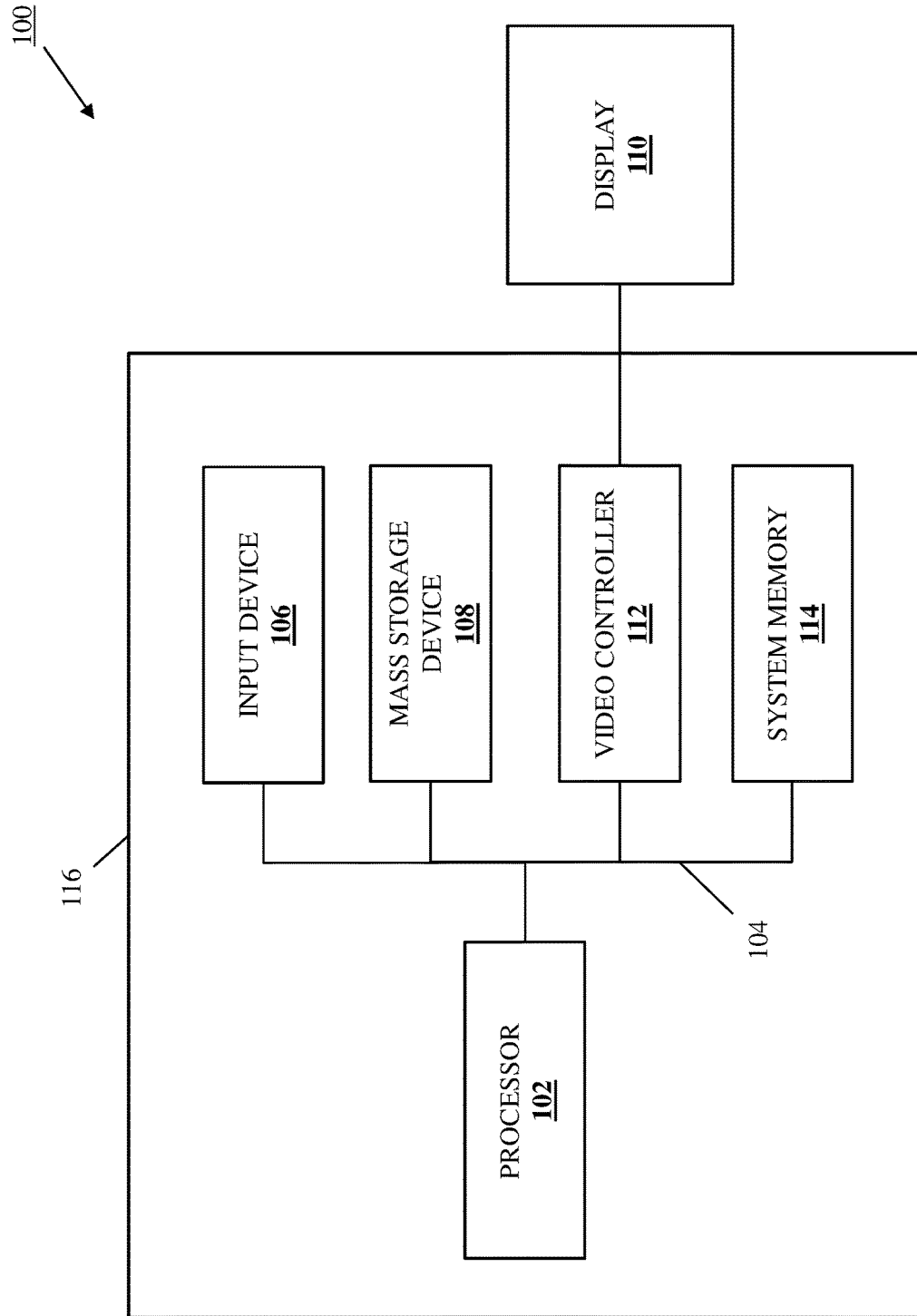
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
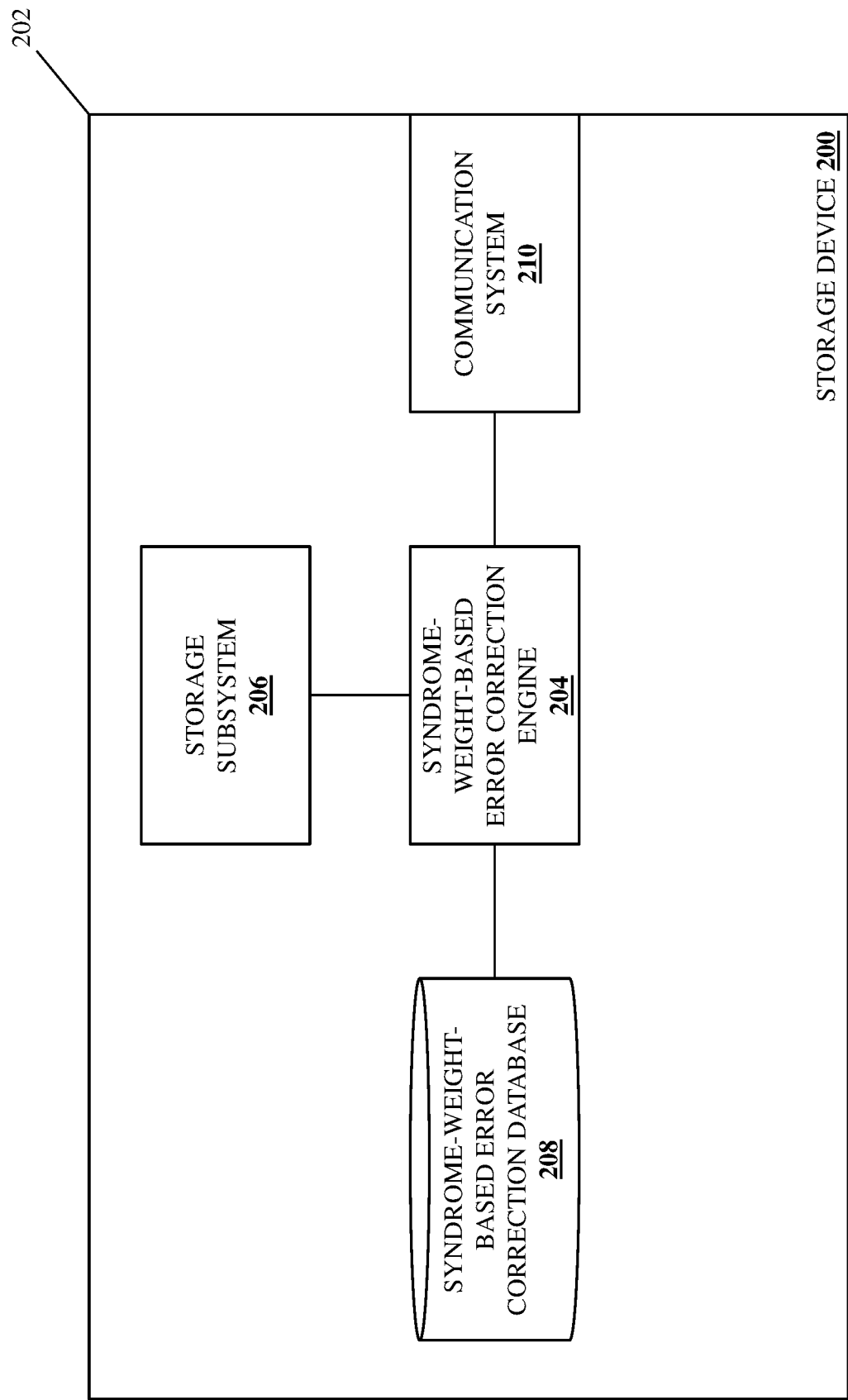
FIG. 2 is a schematic view illustrating an embodiment of a storage device that may include the storage device syndrome-weight-based error correction system of the present disclosure.

Referring now to FIG. 2, an embodiment of a storage device 200 is illustrated that may include the storage device syndrome-weight-based error correction system of the present disclosure. In an embodiment, the storage device 200 may be provided in the IHS 100 discussed above with reference to FIG. 1 (e.g., as the mass storage device 108 discussed above with reference to FIG. 1), and specific examples may be provided by a Solid State Drive (SSD) storage device. However, while illustrated and discussed as being provided by an SSD storage device, one of skill in the art in possession of the present disclosure will recognize that the functionality of the storage device 200 discussed below may be provided in other types of storage devices that are configured to operate similarly as the storage device 200 discussed below. In the illustrated embodiment, the storage device 200 includes a chassis 202 that houses the components of the storage device 200, only some of which are illustrated and described below.

For example, the chassis 202 may house a processing system (not illustrated, but which may include the processor 102 discussed above with reference to FIG. 1) and a memory system (not illustrated, but which may include the memory 114 discussed above with reference to FIG. 1) that is coupled to the processing system and that includes instructions that, when executed by the processing system, cause the processing system to provide a syndrome-weight-based error correction engine 204 that is configured to perform the functionality of the syndrome-weight-based error correction engines, syndrome-weight-based error correction subsystems, and/or storage devices discussed below. To provide a specific example, the processing system and memory system that provide the syndrome-weight-based error correction engine 204 may be included in the storage device 200 as part of a storage device controller (e.g., an SSD controller), storage device firmware (e.g., SSD firmware), and/or other storage device components that would be apparent to one of skill in the art in possession of the present disclosure.

The chassis 202 may also house a storage subsystem 206 that is coupled to the syndrome-weight-based error correction engine 204 (e.g., via a coupling between the storage subsystem 206 and the processing system) and that may be provided by NAND storage subsystems and/or other SSD storage subsystems that would be apparent to one of skill in the art in possession of the present disclosure. However, while described as being provided by NAND storage subsystems, one of skill in the art in possession of the present disclosure will appreciate that other storage subsystems may benefit from the teachings of the present disclosure and thus will fall within its scope as well. In the illustrated embodiment, the syndrome-weight-based error correction engine 204 may have access to syndrome-weight-based error correction database 206 that is configured to store any of the information utilized by the syndrome-weight-based error correction engine 204 discussed below, and one of skill in the art in possession of the present disclosure will appreciate how the syndrome-weight-based error correction database 206 may be provided by the storage subsystems 208 and/or other storage elements included in the chassis 202.

The chassis 202 may also house a communication system 210 that is coupled to the syndrome-weight-based error correction engine 204 (e.g., via a coupling between the communication system 210 and the processing system) and that may be provided by any of a variety of storage device communication components that would be apparent to one of skill in the art in possession of the present disclosure. However, while a specific storage device 200 has been illustrated and described, one of skill in the art in possession of the present disclosure will recognize that storage devices (or other devices operating according to the teachings of the present disclosure in a manner similar to that described below for the storage device 200) may include a variety of components and/or component configurations for providing conventional storage device functionality, as well as the functionality discussed below, while remaining within the scope of the present disclosure as well.

Referring now to FIGS. 3A, 3B, 3C, 3D, and 3E, an embodiment of a method 300 for correcting errors in a storage device based on syndrome weights is illustrated. As discussed below, the systems and methods of the present disclosure may leverage the syndrome weights of final codeword candidates generated during error correction hard decoding operations to skip conventional error correction stages in some situations, and/or verify the accuracy of conventional error correction stages in other situations. For example, the storage device syndrome-weight-based error correction system of the present disclosure may include a syndrome-weight-based error correction subsystem coupled to a storage subsystem in a chassis. The syndrome-weight-based error correction subsystem performs a plurality of respective first error correction hard decoding operations on the storage subsystem that each utilize respective read voltage thresholds and that each generate a respective final codeword candidate having a respective syndrome weight. The syndrome-weight-based error correction subsystem identifies a first syndrome weight of a first final codeword candidate that was generated via the performance of one of the plurality of respective first error correction hard decoding operations that utilized first read voltage thresholds and that is lower than the syndrome weights of the final codeword candidates generated via the performance of the others of the plurality of respective first error correction hard decoding operations, and performs error correction soft decoding operations using the first read voltage thresholds. As such, the time needed to perform error correction in storage devices is reduced.

As discussed above, the storage device syndrome-weight-based error correction system of the present disclosure may leverage syndrome weights associated with storage device error correction techniques. For example, consider a linear error correction code C defined over a finite field F, with a codeword length n and a parity check matrix H (i.e., each row of the parity check matrix H represents a parity check equation). For a column vector $x \in F$ of codeword length n, the syndrome s of the column vector x is defined as the multiplicative product of the parity check matrix H and the column vector x over the finite field F (i.e., s=Hx), while the syndrome weight is the number of non-zero entries in the syndrome s and represents the number of unsatisfied parity check equations associated with the column vector x. As such, if the column vector x is a codeword of the linear error correction code C, it must satisfy all of the parity check equations of the linear error correction code C, and thus the syndrome s and the syndrome weight of column vector x must be zero.

For error correction codes such as Low-Density Parity Check (LDPC) codes, the condition discussed above is used in an iterative decoder to check whether error correction has succeeded or not. In particular, the syndrome of a codeword "candidate" is computed after each decoding operation: if the syndrome is zero then decoding operations will stop and its corresponding codeword candidate is taken to be the correct codeword, if not the decoding operations will continue. Furthermore, if the syndrome remains non-zero after a pre-determined number of decoding operation iterations, decoding operations are considered to have been unsuccessful.

With reference to FIG. 4, an embodiment of conventional storage device error correction stages 400 are illustrated that one of skill in the art in possession of the present disclosure will recognize provides a conventional error recovery scheme for SSD storage devices that employ LDPC codes for error correction. The conventional storage device error correction stages 400 include error correction stage 402 where LDPC hard decoding initial operations are performed. For example, at error correction stage 402, a pre-determined/initial set of read voltage thresholds may be used to read data from a NAND storage subsystem (e.g., a NAND page) in the SSD storage device, followed by the performance of LDPC hard decoding operations on that data. As will be appreciated by one of skill in the art in possession of the present disclosure, LDPC hard decoding operations may use an iterative decoder that may be provided by a bit-flip decoder (i.e., which takes as its inputs 0's and 1's) or a message-passing decoder (i.e., which takes as its inputs Log-Likelihood Ratio (LLR) values that are discretized to 2 values when used for hard decoding operations).

In the event the LDPC hard decoding initial operations are unsuccessful at error correction stage 402, it is assumed that the pre-determined/initial set of read voltage thresholds were inaccurate for the targeted NAND storage subsystem (e.g., the targeted NAND page), and the conventional storage device error correction stages 400 may proceed to error corrections stages 404a, 404b, and up to 404c in which respective LDPC hard decoding retry operation(s) may be performed that each use a different pre-determined set of read voltage thresholds to read the NAND storage subsystem (e.g., called a "read retry") followed by an LDPC hard decoding retry operation. As such, the conventional storage device error correction stages 400 assume unsuccessful LDPC hard decoding operations are due to the use of a sub-optimal set of read voltage thresholds for a targeted NAND storage subsystem, and will then attempt to find the optimal set of read voltage thresholds via trial and error during the LDPC hard decoding retry operation(s) (e.g., as information on the conditions of the NAND storage subsystem that would otherwise help directly identify that optimal set of read voltage thresholds may not be available).

In the event some predetermined number of the LDPC hard decoding retry operations at the error correction stages 404a-404c are unsuccessful, the conventional storage device error correction stages 400 may proceed to error correction stage 406 in which LDPC hard decoding read voltage threshold real-time search operations are performed that include a real-time "valley search" on cell voltage distributions to identify "optimal/central" read voltage thresholds that allow for the reading of certain bits, with those "optimal/central" read voltage thresholds used in an LDPC hard decoding retry operation. As will be appreciated by one of skill in the art in possession of the present disclosure, the real-time "valley search" on the cell voltage distributions will identify "optimal/central" read voltage thresholds that provide a desired separation between voltages indicative of "1's", and voltages indicative of "0's".

In the event the LDPC hard decoding retry operation at error correction stage 406 are unsuccessful, it is assumed that the number of bit errors in the data has exceeded the error correction capabilities of LDPC hard decoding operations, and the conventional storage device error correction stages 400 may proceed to error correction stage 408 in which LDPC soft decoding operations are performed that utilize the "optimal" and/or "central" read voltage thresholds identified at error correction stage 406. As will be appreciated by one of skill in the art in possession of the present disclosure, LDPC soft decoding operations may use an iterative decoder that may be provided by a message-passing decoder (i.e., which takes as its inputs LLR values that are discretized to more than 2 values when used for soft decoding operations in order to increase the error correction capabilities).

For example, at error correction stage 408, the iterative decoder may be provided with LLR values that reflect which bits are more likely "1's" and "0's", and which bits are less likely "1's" and "0's". To provide a specific example, the real-time "valley search" performed at error correction stage 406 may identify an "optimal/central" read voltage threshold "X" that is used to read bits as part of the LDPC hard decoding retry operations. In order to determine the likelihood of bits for the LDPC soft decoding operations performed at error correction stage 408, additional reads of the storage subsystem 206 may be performed at "X+a" and "X-b" (with a and b often provided by the same value, but not required to be), and the bits obtained from these reads will be examined. If a bit in a certain position remains a "1" or "0" for each of these reads, the read voltage is not near the cutoff threshold and the bit is more likely to be correct and is then given a relatively higher LLR magnitude due to that certainty. If a bit in a certain position changes between a "1" or "0" across these reads, the read voltage is near the cutoff threshold and the bit is more likely to be incorrect and is then given a relatively lower LLR magnitude due to that uncertainty (which results in that bit being more likely to be changed by the iterative decoder). As such, such LDPC soft decoding operations require additional reads from the NAND storage subsystem using read voltage thresholds that are in the proximity of the "optimal/central" read voltage thresholds in order to obtain more than 2 discretized LLR values as its inputs, and thus LDPC soft decoding operations are relatively more time consuming than the LDPC hard decoding operations discussed above.

In the event the LDPC soft decoding operations at error correction stage 408 are unsuccessful, an uncorrectable read error may be registered and the conventional storage device error correction stages 400 may proceed to error correction stage 410 where Redundant Array of Independent Disk (RAID)-assisted data recovery operations may be performed using any of a variety of RAID-assisted data recovery techniques that would be apparent to one of skill in the art in possession of the present disclosure.

As discussed in further detail below, the inventors of the present disclosure have recognized opportunities to improve conventional error correction systems like those discussed above by leveraging the syndrome weights of the final codeword candidates generated during the LDPC hard decoding operations discussed above. For example, if a final codeword candidate generated during an LDPC hard decoding operation has a relatively large syndrome weight, then a relatively large number of parity check equations for that final codeword candidate remain unsatisfied, and thus a relatively large number of bit errors remain in that final codeword candidate. As such, the syndrome weight of a final codeword candidate generated during an LDPC hard decoding operation may be utilized as a rough indicator of how "close" a final codeword candidate is from being correctly decoded. However, one of skill in the art in possession of the present disclosure will appreciate how the codeword length of a final codeword candidate is much larger than the number of parity check equations, and thus a one-to-one mapping between the number of bit errors in a final codeword candidate and its syndrome weight does not exist (e.g., for a given number of bit errors in a final codeword candidate, a distribution of syndrome weights results due to a relatively large number of combinations of error bit locations). Thus, the syndrome weight of a final codeword candidate generated during an LDPC hard decoding operation only provides approximate guidance on the number of bit errors in that final codeword candidate.

The systems and methods described below describe multiple techniques for using the syndrome weights of final codeword candidates generated during LDPC hard decoding operations. In general, embodiments of the present disclosure may use "final" syndrome weights of final codeword candidates generated during LDPC hard decoding operations to determine whether to skip at least some of the conventional error correction stages discussed above that will likely result in LDPC decoding failures in order to improve read latency, Quality of Service (QOS), and/or other operations of storage devices. Furthermore, embodiments of the present disclosure may use a "final" syndrome weight of a final codeword candidate generated during an LDPC hard decoding operation to determine whether read voltage thresholds determined during LDPC hard decoding read voltage threshold real-time search operation are "optimal", and replace those read voltages thresholds if necessary, which helps increase the probability that LDPC soft decoding operations will succeed (i.e., as the correction capabilities of LDPC soft decoding operations depends significantly on the accuracy of the "optimal" read voltages determined during the LDPC hard decoding read voltage threshold real-time search options). As such, while the method 300 is described as including the use of each of the syndrome weight techniques described herein, one of skill in the art in possession of the present disclosure will appreciate how methods that utilize fewer (and in some cases, only one) of those syndrome weight techniques will fall within the scope of the present disclosure as well.

Figure 3A:
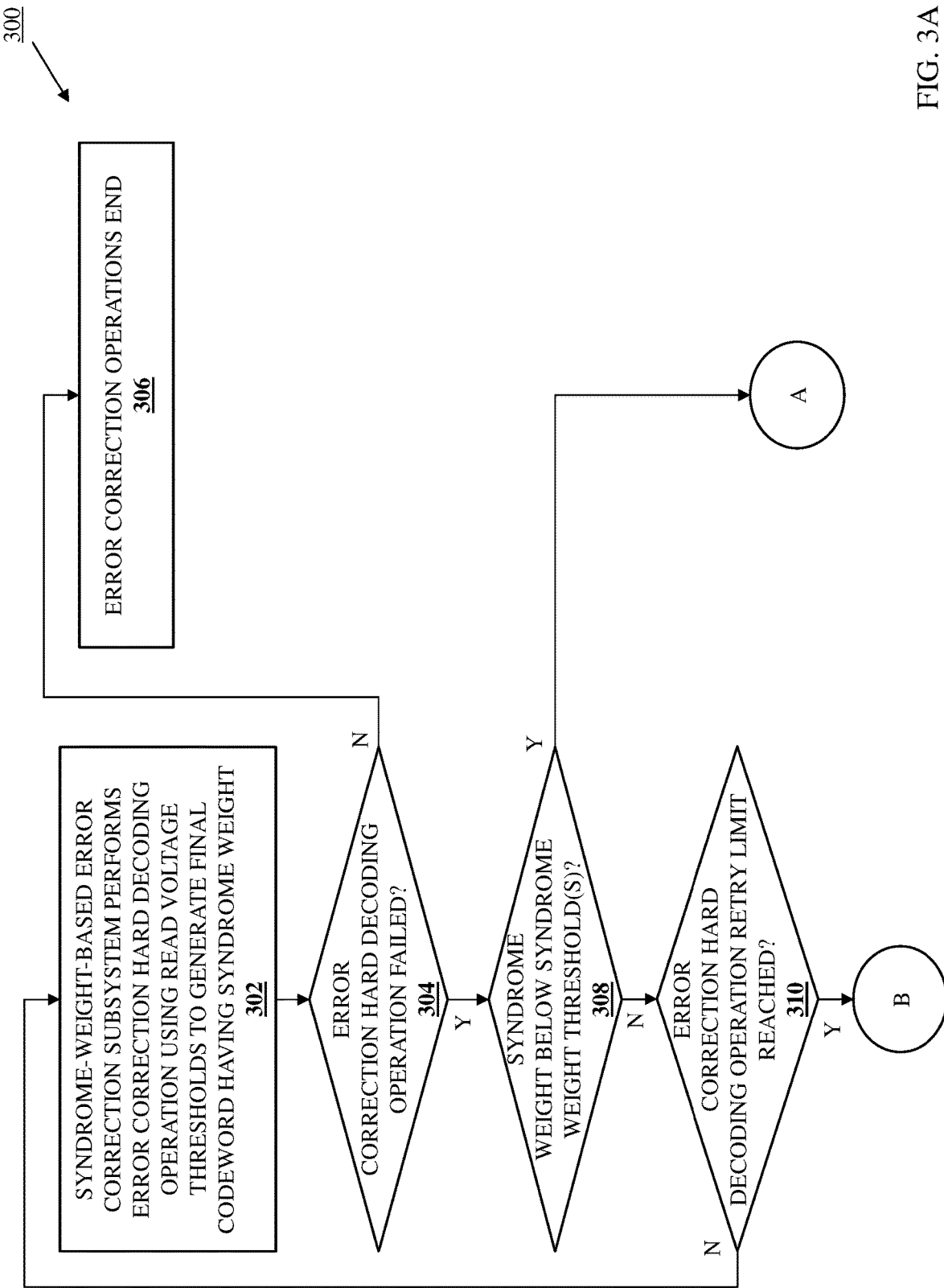
FIG. 3A is a flow chart illustrating an embodiment of a portion of a method for correcting errors in a storage device based on syndrome weights.
Figure 5A:
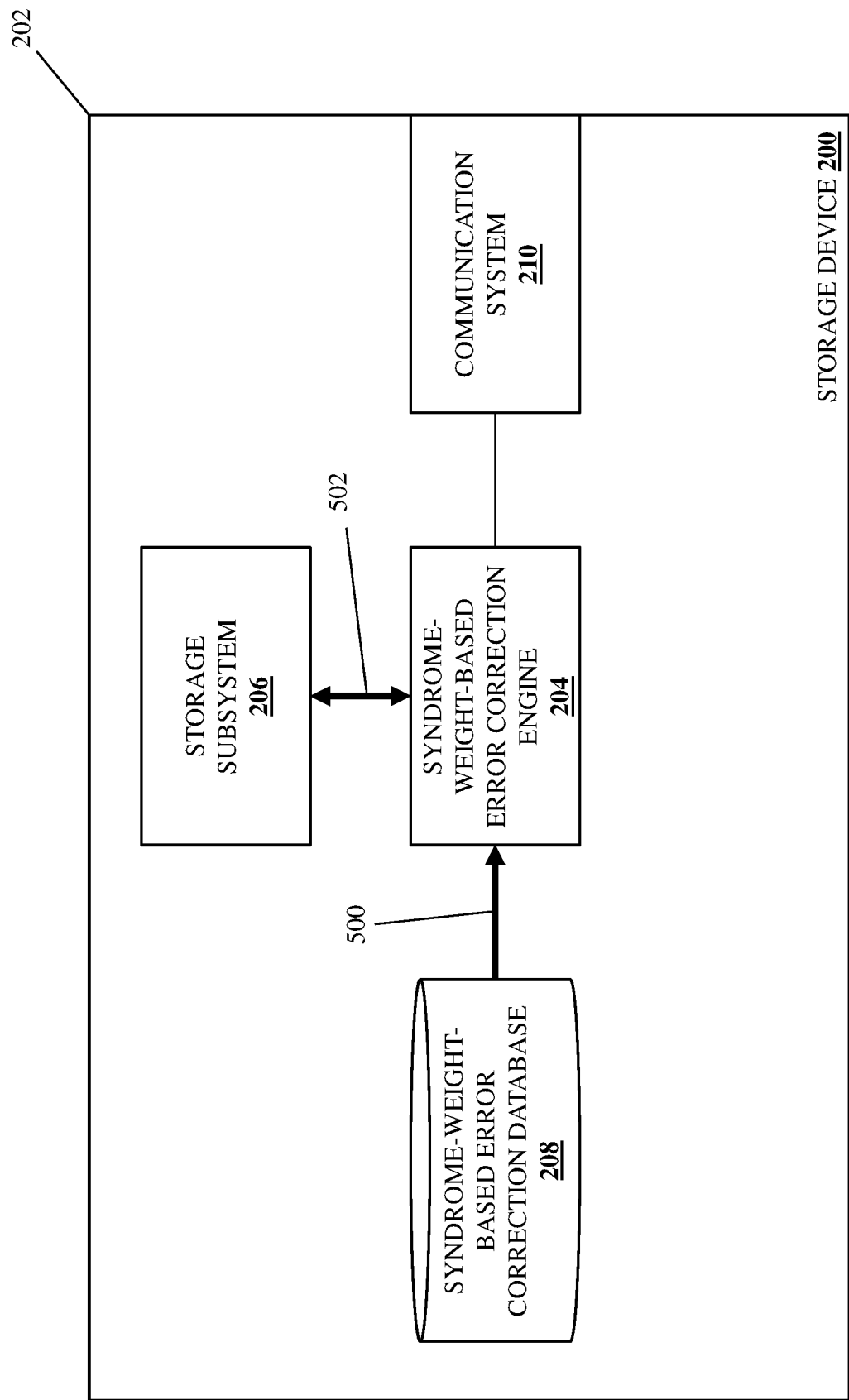
FIG. 5A is a schematic view illustrating an embodiment of the operation of the storage device of FIG. 2 during the method of FIGS. 3A-3E.

With reference to FIG. 3A, the method 300 begins at block 302 where a syndrome-weight-based error correction subsystem performs an error correction hard decoding operation using read voltage thresholds to generate a final codeword candidate having a syndrome weight. With reference to FIG. 5A, in an embodiment of block 302, the syndrome-weight-based error correction engine 204 in the storage device 200 may perform read voltage threshold retrieval operations 500 to retrieve a set of read voltage thresholds, and then may perform an LDPC hard decoding operation 502 using that set of read voltage thresholds to read data from the storage subsystem 206, generate a final codeword candidate, and determine a syndrome weight for that final codeword candidate. As will be appreciated by one of skill in the art in possession of the present disclosure, the initial performance of block 302 may be performed substantially similarly to the error correction stage 402 discussed above in which the LDPC hard decoding initial operations are performed.

The method 300 then proceeds to decision block 304 where it is determined whether the error correction hard decoding operation failed or was otherwise unsuccessful. In an embodiment, at decision block 304, the syndrome-weight-based error correction engine 204 in the storage device 200 may determine whether the LDPC hard decoding operation 502 performed at block 302 failed or was otherwise unsuccessful based on whether the syndrome/syndrome weight of the final codeword candidate generated via the LDPC hard decoding operation 502 is zero (indicating a successful LDPC hard decoding operation) or not (indicating an unsuccessful LDPC hard decoding operation), as described in detail above. If, at decision block 304, it is determined that the error correction hard decoding operation has not failed or was otherwise successful, the method 300 proceeds to block 306 where error correction operations end.

Figure 5B:
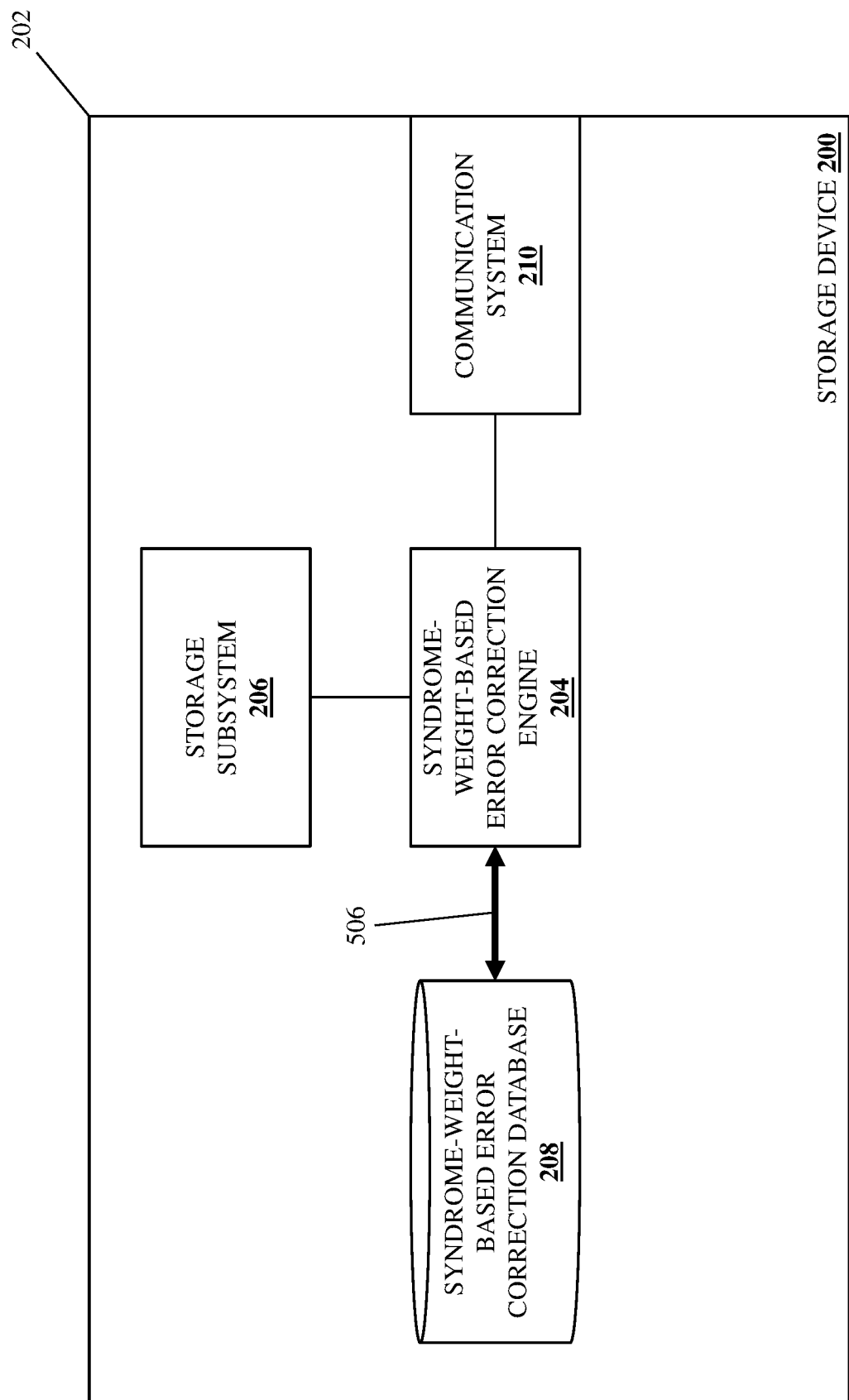
FIG. 5B is a schematic view illustrating an embodiment of the operation of the storage device of FIG. 2 during the method of FIGS. 3A-3E.

If at decision block 304, it is determined that the error correction hard decoding operation has failed or was otherwise unsuccessful, the method 300 proceeds to decision block 308 where it is determined whether the syndrome weight is below one or more syndrome weight thresholds. With reference to FIG. 5B, in an embodiment of decision block 308, the syndrome-weight-based error correction engine 204 in the storage device 200 may perform syndrome weight threshold check operations 506 that may include comparing the syndrome weight of the final codeword candidate generated by block 302 to one or more syndrome weight thresholds that, in the illustrated embodiment, may be stored in the syndrome-weight-based error correction database 208. In some embodiments, the syndrome weight threshold used at decision block 308 may be provided by a relatively small syndrome weight value that, below which, one of skill in the art in possession of the present disclosure would recognize as being indicative of final codeword candidates that are relatively close to being corrected. In experimental embodiments, the inventors of the present disclosure have found that, for a 100 FBC limit, syndrome weight thresholds between 250-300 are indicative of final codeword candidates that are deemed close enough to being corrected for the purposes of the remaining blocks of the method 300, although other syndrome weight thresholds will fall within the scope of the present disclosure as well.

In some embodiments, the syndrome weight threshold used at decision block 308 may be provided by a relatively large final syndrome weight/initial syndrome weight difference percentage. For example, a final syndrome weight/initial syndrome weight difference percentage (SYN.WT.DIFF. %) may be determined by the following equation:

$$\text{SYN.WT.DIFF \%}=[(\text{SYN.WT}_{INITIAL}-\text{SYN.WT}_{FINAL})/\text{SYN.WT}_{INITIAL}]$$

where "SYN. $\text{WT}_{INITIAL}$" is an initial syndrome weight before an LDPC hard decoding operation and "SYN.$\text{WT}_{FINAL}$" is a final syndrome weight after that LDPC hard decoding operation. As such, at decision block 308 and following the generation of a final codeword candidate having a final syndrome weight using LDPC hard decoding operations at block 302, the syndrome-weight-based error correction engine 204 in the storage device 200 may use that final syndrome weight and the corresponding initial syndrome weight for the data prior to that LDPC hard decoding operation to calculate the final syndrome weight/initial syndrome weight difference percentage above, and then determine whether that final syndrome weight/initial syndrome weight difference percentage is above the syndrome weight threshold provided by the relatively large final syndrome weight/initial syndrome weight difference percentage discussed above.

In an embodiment, relatively less "stringent" embodiments of the present disclosure may utilize only the relatively small syndrome weight value as the syndrome weight threshold discussed above, while relatively more "stringent" embodiments of the present disclosure may utilize the relatively small syndrome weight value followed by the relatively large final syndrome weight/initial syndrome weight difference percentage as the syndrome weight thresholds discussed above. As will be appreciated by one of skill in the art in possession of the present disclosure, the relatively more "stringent" embodiments of the present disclosure discussed above may increase the probability that the LDPC soft decoding operations discussed below will succeed following an LDPC hard decoding operation that generates a final codeword candidate having a syndrome weight that is below the syndrome weight thresholds, as LDPC hard decoding operations that result in a final syndrome weight/initial syndrome weight difference percentage that is greater than the syndrome weight threshold provided by the relatively large final syndrome weight/initial syndrome weight difference percentage are indicative that the iterative decoding process provided by the LDCP hard decoding operations have already corrected a relatively large fraction of the bit errors and are thus converging towards a codeword. However, while specific examples are described, one of skill in the art in possession of the present disclosure will appreciate how a variety of syndrome weight thresholds may provide for the benefits described below, and thus will fall within the scope of the present disclosure as well.

If, at decision block 308, it is determined that the syndrome weight is not below one or more syndrome weight thresholds, the method 300 proceeds to decision block 310 where it is determined whether an error correction hard decoding operation retry limit has been reached. In an embodiment, at decision block 310 and in response to the syndrome weight of the final codeword candidate not being below the syndrome weight threshold at decision block 308, the syndrome-weight-based error correction engine 204 in the storage device 200 may perform error correction hard decoding operation retry limit determination operations that may include determining whether a number of LDPC hard decoding operations performed during the method 300 has reached a limit. As discussed above, a limit may be set on a number of LDPC hard decoding retry operations that may be performed as part of the error correction stages 404a-404c discussed above, and thus iterations of block 302 during any performance of the method 300 may be tracked to determine whether that limit has been reached.

If, at decision block 308, it is determined that the error correction hard decoding operation retry limit has not been reached, the method 300 returns to block 302. Continuing with the example above that describes an initial performance of block 302, the method 300 may then loop through blocks 302, 304, 308, and 310 to perform the LDPC hard decoding retry operations (e.g., as part of any of the error correction stages 404a-404c discussed above with reference to FIG. 4) as long as those LDPC hard decoding operations fail or are otherwise unsuccessful, the syndrome weight of their resulting final codeword candidates are not below the syndrome weight threshold(s), and the LDPC hard decoding operation retry limit has not been reached. To provide a specific example, following the failure of the LDPC hard decoding initial operations (e.g., at the error correction stage 402 discussed above with reference to FIG. 4) using first read voltage thresholds and in a situation where the syndrome weight of the resulting final codeword candidate is not below the syndrome weight threshold and the LDPC hard decoding operation retry limit has not been reached, first LDPC hard decoding retry operations (e.g., at the error correction stage 404a discussed above with reference to FIG. 4) using second read voltage thresholds may be performed.

In the event those first LDPC hard decoding retry operations (e.g., at the error correction stage 404a discussed above with reference to FIG. 4) fail or are otherwise unsuccessful and in a situation where the syndrome weight of the resulting final codeword candidate is not below the syndrome weight threshold and the LDPC hard decoding operation retry limit has not been reached, second LDPC hard decoding retry operations (e.g., at the error correction stage 404b discussed above with reference to FIG. 4) using third read voltage thresholds may be performed, and this process may be repeated until LDPC hard decoding retry operations succeed, a syndrome weight of a final codeword candidate generated by LDPC hard decoding retry operations is below the syndrome weight threshold, or the LDPC error correction hard decoding operation retry limit is reached.

As will be appreciated by one of skill in the art in possession of the present disclosure, the sets of read voltage thresholds used in the LDCP hard decoding initial operations and LDPC hard decoding retry operations are typically relatively different from each other, as they are typically chosen to cover a relatively wide range of NAND storage subsystem conditions such as, for example, different Program/Erase (P/E) cycle counts, different data retention durations, different die-to-die variations, different block-to-block variations, and/or other NAND storage subsystem conditions that would be apparent to one of skill in the art in possession of the present disclosure. As such, in the event a set of read voltage thresholds used in an LDPC hard decoding operation that failed or was otherwise unsuccessful are already reasonably accurate, the use of a relatively different set of read voltage thresholds in a subsequent LDPC hard decoding retry operation is not very useful and operates to increase read latency for the storage device. As will be appreciated by one of skill in the art in possession of the present disclosure, the determination at decision block 308 operates to identify such situations (i.e., where a set of read voltage thresholds used in an LDPC hard decoding operation that failed or was otherwise unsuccessful are already reasonably accurate) and, in response, perform error correction stages in a manner that will reduce the read latency and increase the QoS for the storage device.

Figure 3B:
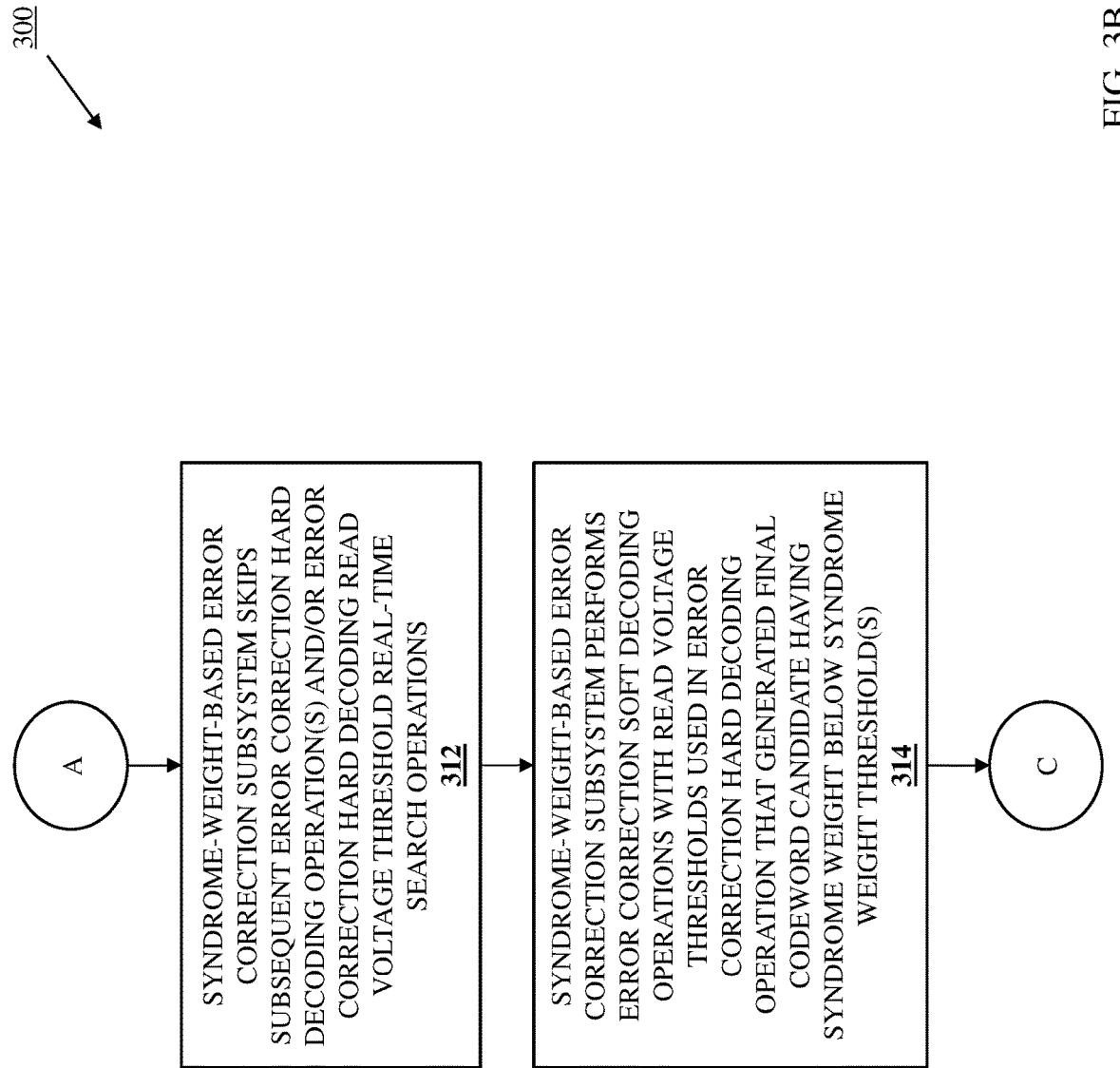
FIG. 3B is a flow chart illustrating an embodiment of a portion of a method for correcting errors in a storage device based on syndrome weights.

With reference to FIG. 3B, if at decision block 308 it is determined that the syndrome weight is below one or more syndrome weight thresholds, the method 300 proceeds to block 312 where the syndrome-weight-based error correction subsystem skips one or more subsequent error correction hard decoding operations and/or error correction hard decoding read voltage real-time search operations. In an embodiment, at block 312 and in response to determining the syndrome weight of a final codeword candidate generated during LDPC hard decoding operations is below the syndrome weight threshold(s), the syndrome-weight-based error correction engine 204 in the storage device 200 may skip subsequent LDPC hard decoding retry operations and/or LDPC hard decoding read voltage threshold real-time search operations. As will be appreciated by one of skill in the art in possession of the present disclosure, the skipping of the LDPC hard decoding read voltage threshold real-time search operations at block 312 may be particularly beneficial with regard to improving read latency in the storage device, as the read latency contribution of such LDPC hard decoding read voltage threshold real-time search operations is typically multiples of the read latency contribution of any of the LDPC hard decoding initial/retry operations.

Figure 6:
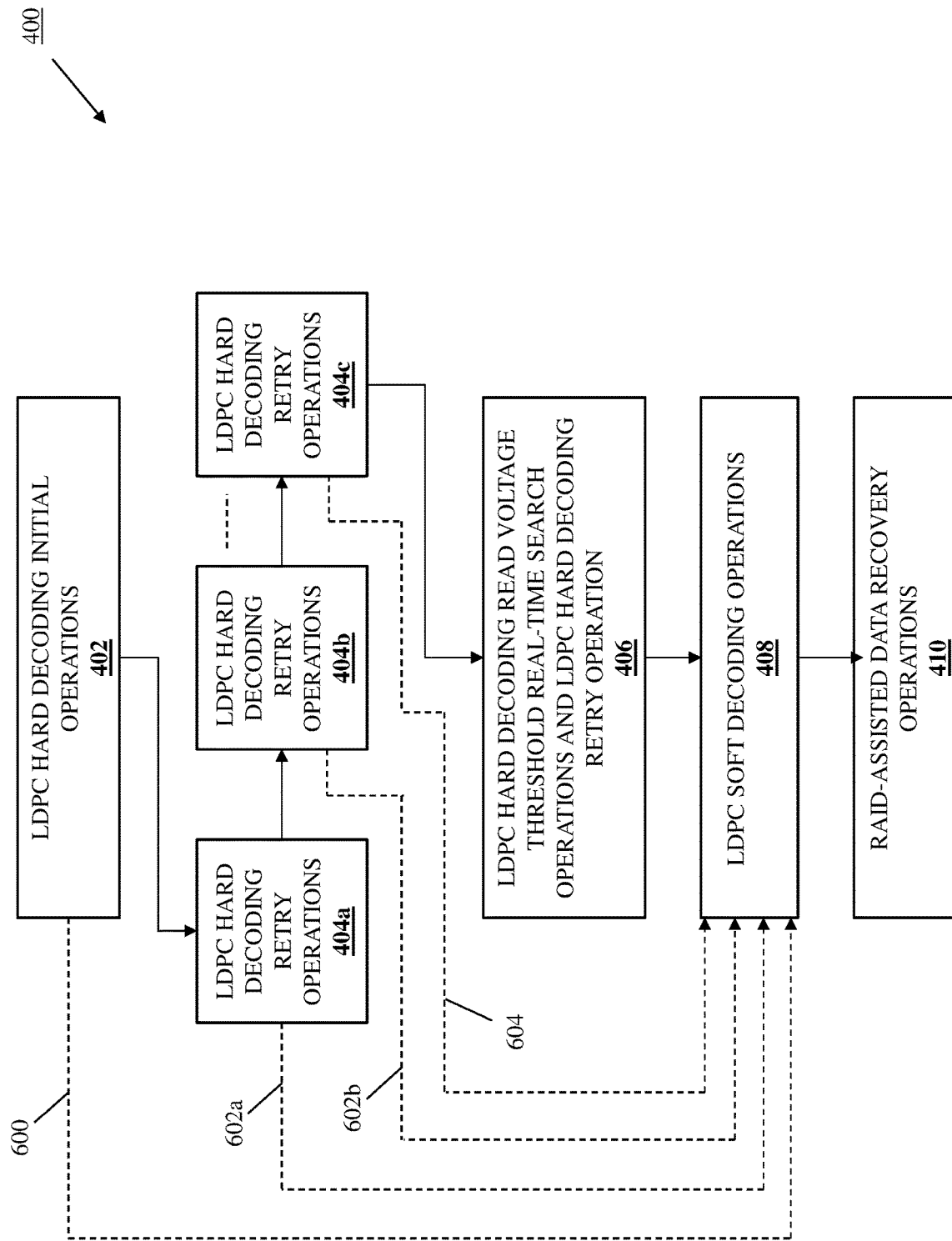
FIG. 6 is a flow chart illustrating an embodiment of modifications to the performance of the conventional storage device error correction stages of FIG. 4 during the method of FIGS. 3A-3E.

In a specific example, a syndrome weight of a final codeword candidate generated at block 302 via the performance of the LDPC hard decoding initial operations (e.g., at the error correction stage 402 discussed above with reference to FIG. 4) may be determined to be below the syndrome weight threshold(s) at decision block 308 and, in response, the syndrome-weight-based error correction engine 204 in the storage device 200 may skip the LDPC hard decoding retry operations that would otherwise be performed up to the LDPC hard decoding retry operation limit discussed above (e.g., at the error correction stages 404a-404c discussed above with reference to FIG. 4), as well as the LDPC hard decoding read voltage threshold real-time search operations that would otherwise be performed (e.g., at error correction stage 406 discussed above with reference to FIG. 4), and may proceed (as indicated by the dotted line 600 in FIG. 6) directly to the performance of the LDPC soft decoding operations (e.g., at the error correction stage 408 discussed above with reference to FIG. 4).

In another specific example, a syndrome weight of a final codeword candidate generated at block 302 via the performance of the LDPC hard decoding retry operations (e.g., at one of the error correction stages 404a, 404b, and up to but not including 404c discussed above with reference to FIG. 4) may be determined to be below the syndrome weight threshold(s) at decision block 308 and, in response, the syndrome-weight-based error correction engine 204 in the storage device 200 may skip the remaining LDPC hard decoding retry operations that would otherwise be performed up to the LDPC hard decoding retry operation limit discussed above (e.g., at the remaining error correction stages up to 404c discussed above with reference to FIG. 4), as well as the LDPC hard decoding read voltage threshold real-time search operations that would otherwise be performed (e.g., at the error correction stage 406 discussed above with reference to FIG. 4), and may proceed (as indicated by the dotted lines 602a or 602b in FIG. 6) directly to the performance of LDPC soft decoding operations (e.g., at the error correction stage 408 discussed above with reference to FIG. 4).

In another specific example, a syndrome weight of a final codeword candidate generated at block 302 via the performance of the LDPC hard decoding retry operation (e.g., at the error correction stage 404c discussed above with reference to FIG. 4) may be determined to be below the syndrome weight threshold(s) at decision block 308 and, in response, the syndrome-weight-based error correction engine 204 in the storage device 200 may skip the LDPC hard decoding read voltage threshold real-time search operations that would otherwise be performed (e.g., at error correction stage 406 discussed above with reference to FIG. 4) and may proceed (as indicated by the dotted line 604 in FIG. 6) directly to the performance of LDPC soft decoding operations (e.g., at error correction stage 408 discussed above with reference to FIG. 4).

Figure 7:
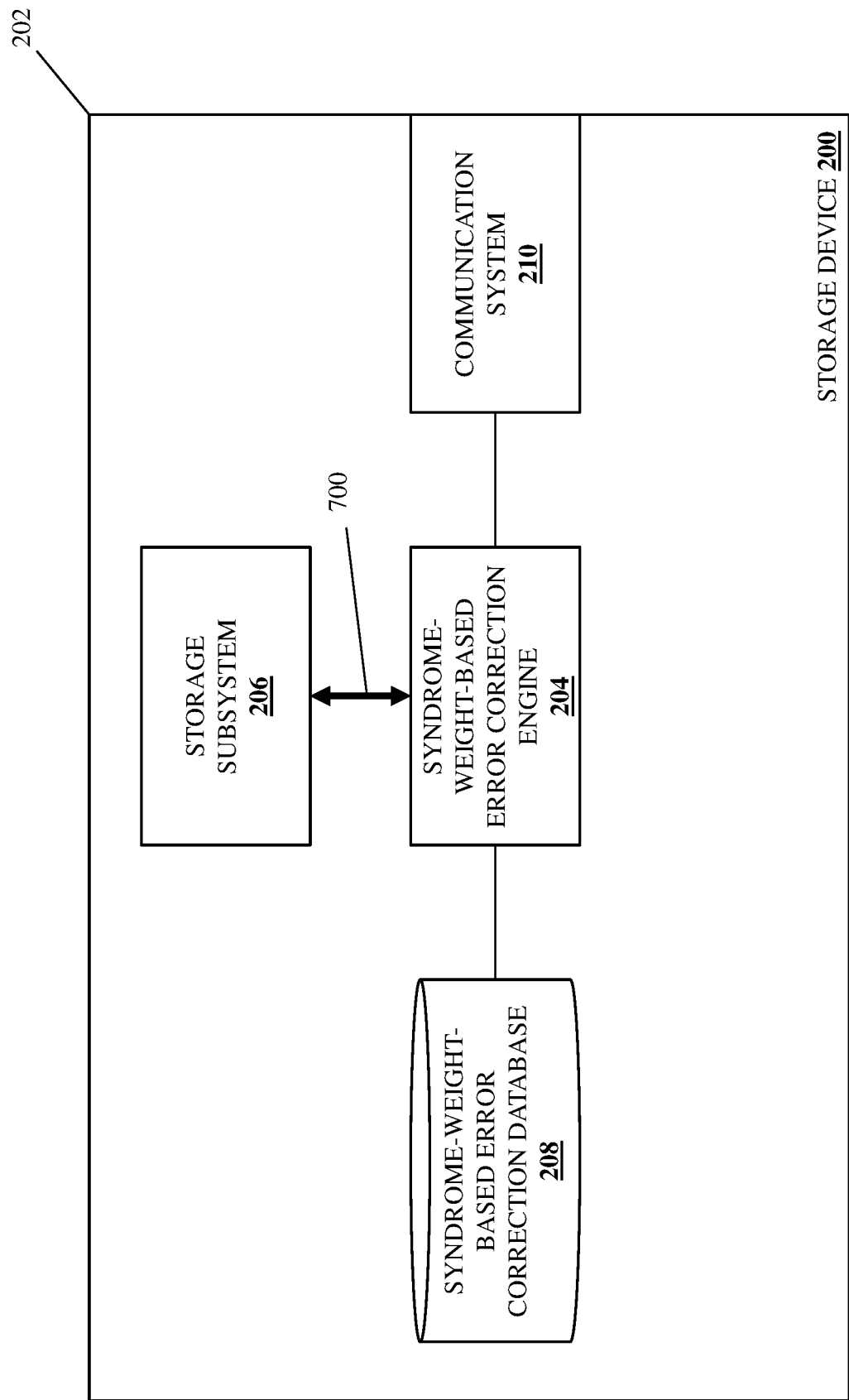
FIG. 7 is a schematic view illustrating an embodiment of the operation of the storage device of FIG. 2 during the method of FIGS. 3A-3E.

The method 300 then proceeds to block 314 where the syndrome-weight-based error correction subsystem performs error correction soft decoding operations with the read voltage thresholds used in the error correction hard decoding operation that generated the final codeword candidate having the syndrome weight below the syndrome weight threshold. With reference to FIG. 7, in an embodiment of block 314, the syndrome-weight-based error correction engine 204 in the storage device 200 may perform an LDPC soft decoding operation 700 that include reading data from the storage subsystem 206 using the set of read voltage thresholds that were used in the LDCP hard decoding operation (i.e., the one of the LDPC hard decoding initial operation or the LDPC hard decoding retry operations) that generated the final codeword candidate having the syndrome weight that was below the syndrome weight threshold(s) and, in response, generating a final codeword candidate.

Figure 3C:
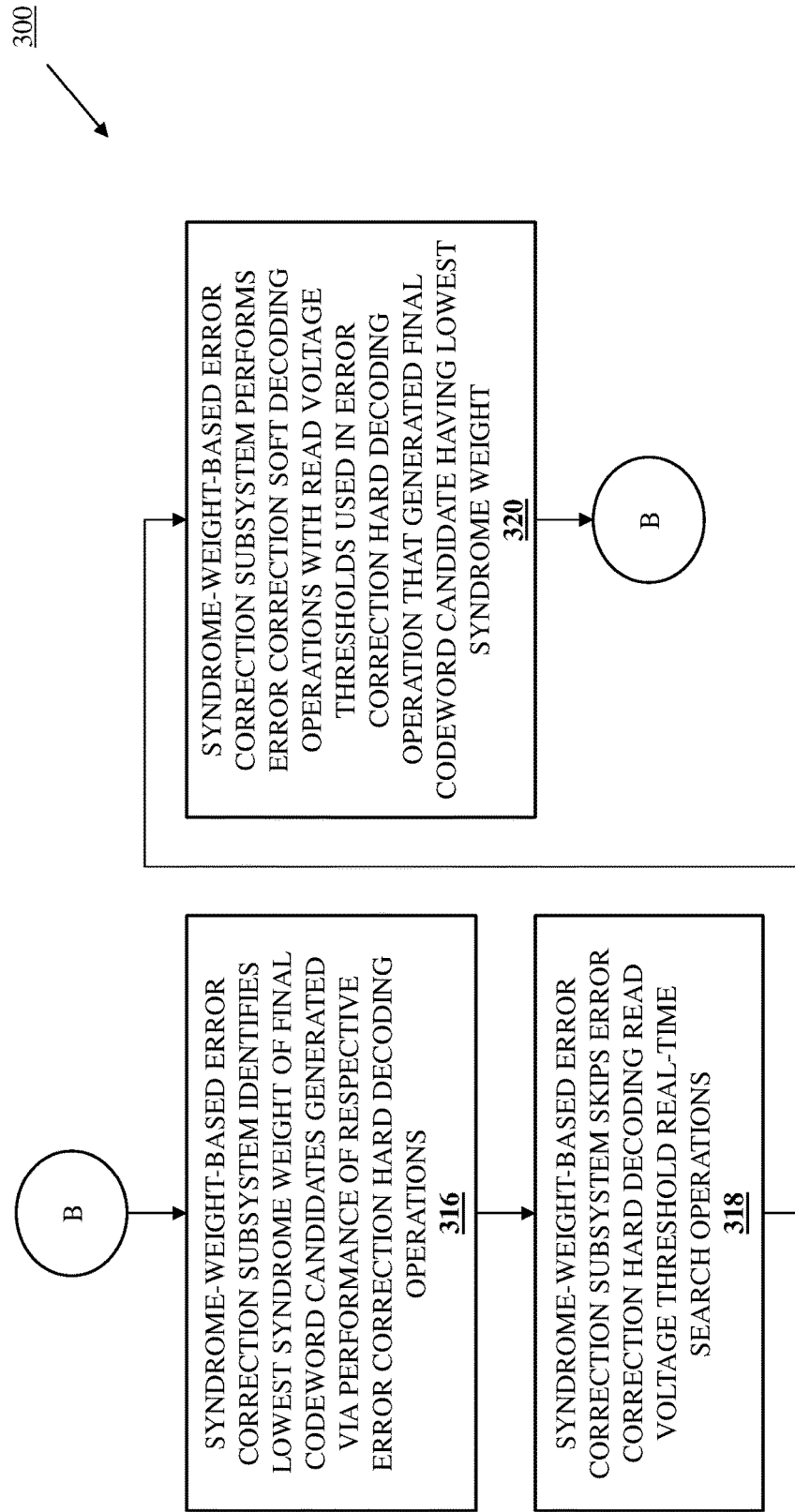
FIG. 3C is a flow chart illustrating an embodiment of a portion of a method for correcting errors in a storage device based on syndrome weights.
Figure 8:
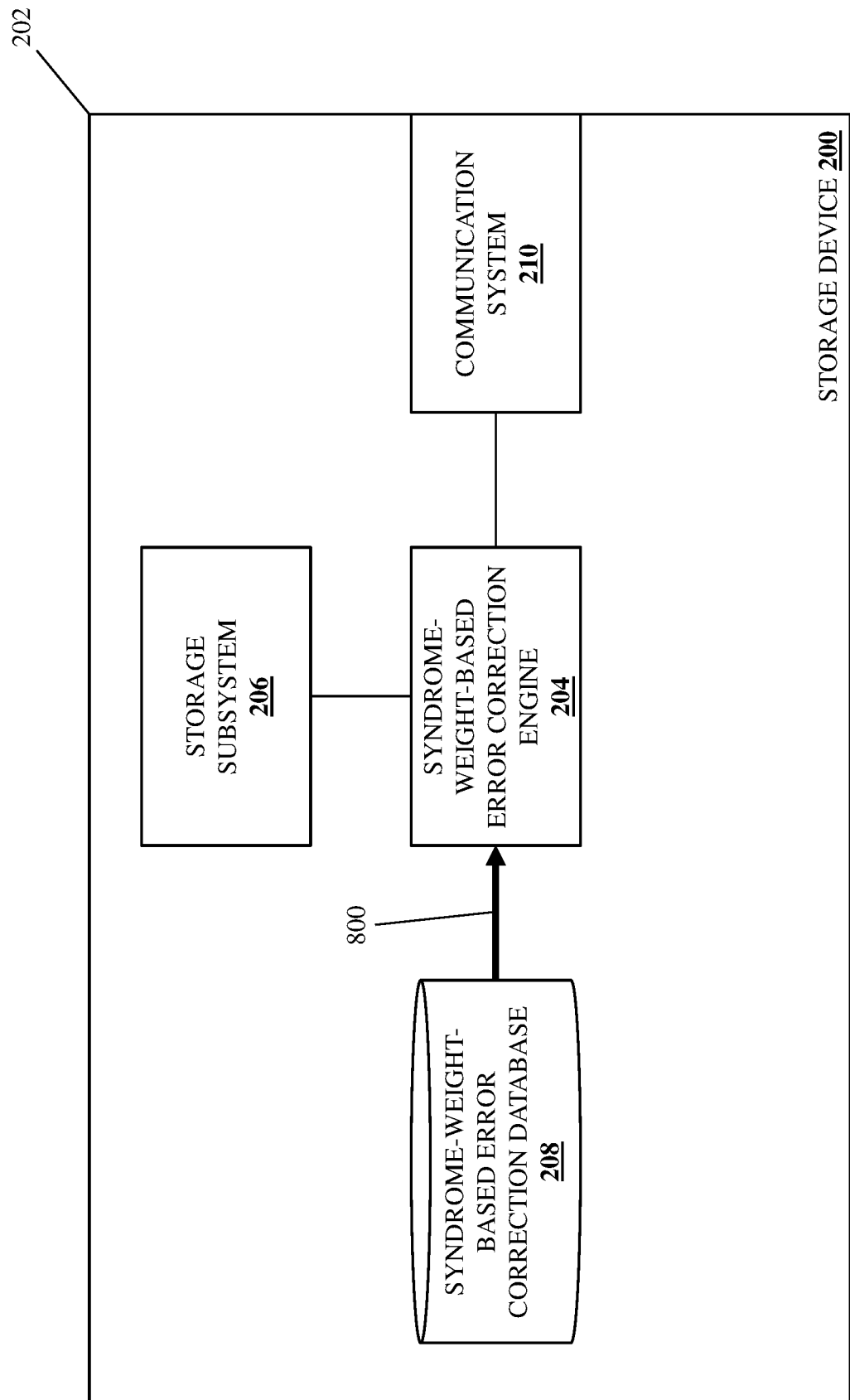
FIG. 8 is a schematic view illustrating an embodiment of the operation of the storage device of FIG. 2 during the method of FIGS. 3A-3E.

With reference to FIG. 3C, if at decision block 310 it is determined that the error correction hard decoding operation retry limit has been reached, the method 300 proceeds to block 316 where the syndrome-weight-based error correction subsystem identifies a lowest syndrome weight of the final codeword candidates generated via the performance of the respective error correction hard decoding operations. With reference to FIG. 8, in an embodiment of block 316, the syndrome-weight-based error correction engine 204 in the storage device 200 may perform lowest syndrome weight identification operations 800 that may include identifying a lowest syndrome weight of a final codeword candidate generated using the LDPC hard decoding operations (e.g., the LDPC hard decoding initial operation and the LDPC hard decoding retry operations) in the syndrome-weight-based error correction database 208.

For example, following each iteration of block 302 that includes the computation or other determination of a syndrome weight for a final codeword candidate generated using the LDPC hard decoding operations as discussed above, the syndrome-weight-based error correction engine 204 may store information about that LDPC hard decoding operation (e.g., the syndrome weight, the set of read voltage thresholds used, etc.) in the syndrome-weight-based error correction database 208 if that syndrome weight is lower than a "previously lowest" syndrome weight for a "previously generated" final codeword candidate from a "previously performed" LDPC hard decoding operation whose information is stored in the syndrome-weight-based error correction database 208 (or if that syndrome weight is for a final codeword candidate generated by the LDPC hard decoding initial operations). In order words, as the method 300 iterates block 302, the syndrome-weight-based error correction engine 204 will keep the syndrome-weight-based error correction database 208 updated with information about the LDPC hard decoding operation that generates the final codeword candidate with the lowest syndrome weight. As such, following the performance of the LDPC hard decoding retry operation that reaches the LDPC hard decoding retry operation limit, the syndrome-weight-based error correction engine 204 may retrieve the information about the LDPC hard decoding operation that generated the final codeword candidate with the lowest syndrome weight from the syndrome-weight-based error correction database 208.

The method 300 then proceeds to block 318 where the syndrome-weight-based error correction subsystem skips error correction hard decoding read voltage threshold real-time search operations. In an embodiment, at block 318 and in response to identifying the lowest syndrome weight of the final codeword candidate generated during LDPC hard decoding operations at block 316, the syndrome-weight-based error correction engine 204 in the storage device 200 may skip LDPC hard decoding read voltage threshold real-time search operations. As discussed above, one of skill in the art in possession of the present disclosure will appreciate how the skipping of the LDPC hard decoding read voltage threshold real-time search operations at block 318 may be particularly beneficial with regard to improving read latency in the storage device 200, as the read latency contribution of such LDPC hard decoding read voltage threshold real-time search operations is typically multiples of the read latency contribution of any of the LDPC hard decoding initial/retry operations.

Figure 9:
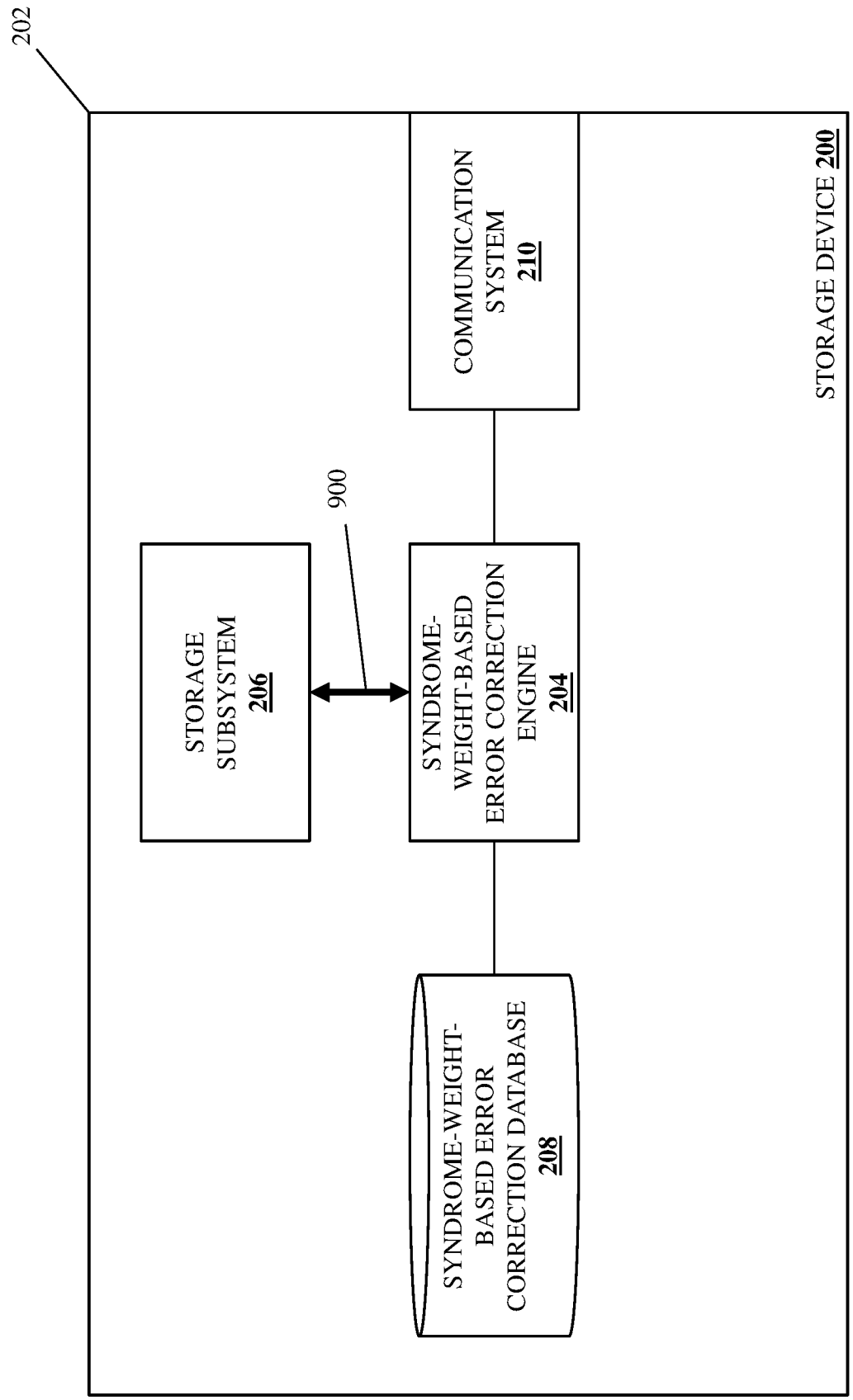
FIG. 9 is a schematic view illustrating an embodiment of the operation of the storage device of FIG. 2 during the method of FIGS. 3A-3E.

The method 300 then proceeds to block 320 where the syndrome-weight-based error correction subsystem performs error correction soft decoding operations with the read voltage thresholds used in the error correction hard decoding operation that generated the final codeword candidate having the lowest syndrome weight. With reference to FIG. 9, in an embodiment of block 320, the syndrome-weight-based error correction engine 204 in the storage device 200 may perform an LDPC soft decoding operation 900 that includes reading data from the storage subsystem 206 using the set of read voltage thresholds that were used in the LDPC hard decoding operation that generated the final codeword candidate having the lowest syndrome weight (i.e., the one of the LDPC hard decoding initial operation or the LDPC hard decoding retry operations) and, in response, generating a final codeword candidate.

Figure 3D:
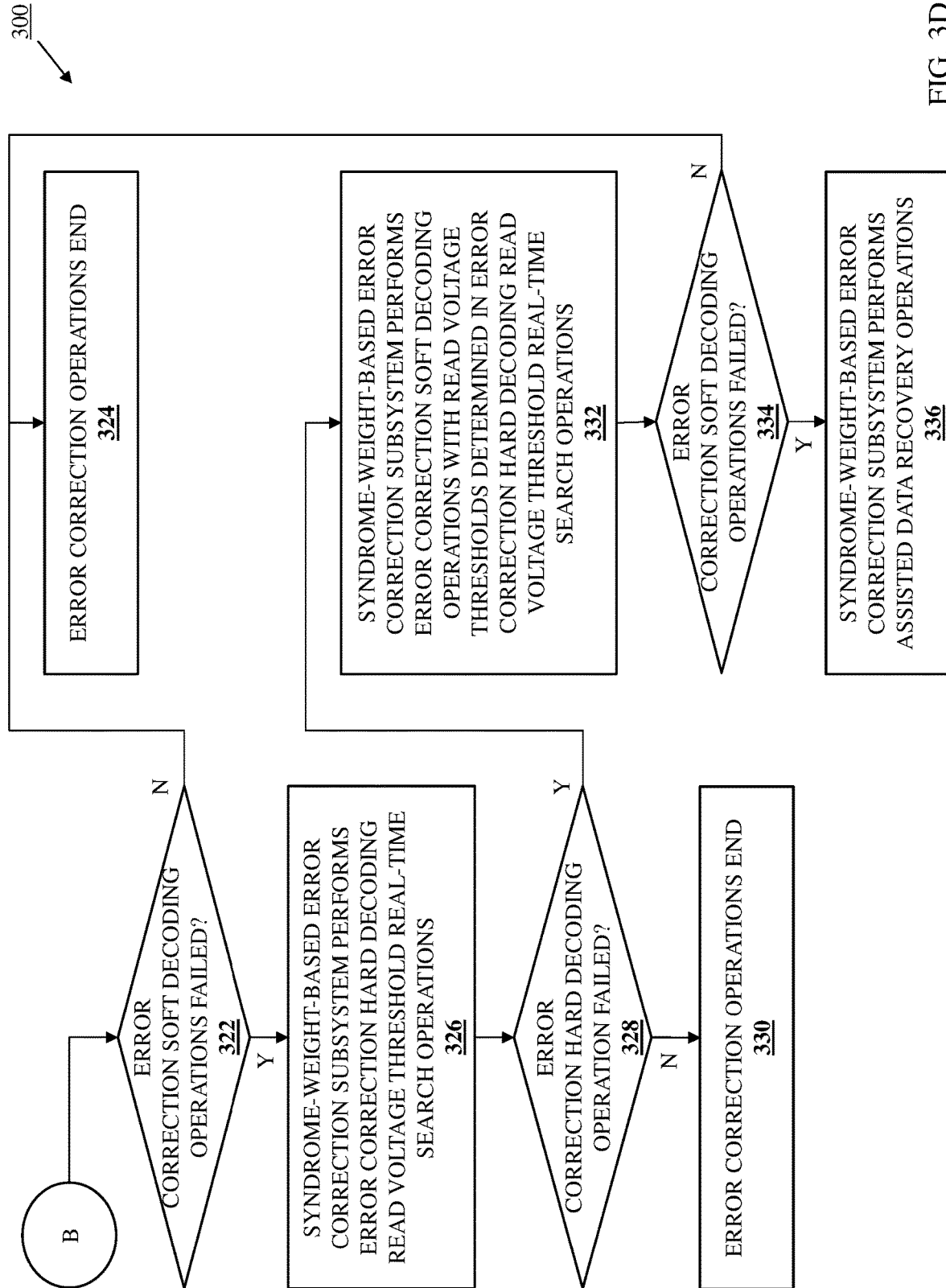
FIG. 3D is a flow chart illustrating an embodiment of a portion of a method for correcting errors in a storage device based on syndrome weights.

With reference to FIG. 3D, following either of block 314 or 320, the method 300 then proceeds to decision block 322 where it is determined whether the error correction soft decoding operation failed or were otherwise unsuccessful. In an embodiment, at decision block 322, the syndrome-weight-based error correction engine 204 in the storage device 200 may determine whether the LDPC soft decoding operation 700 or 900 performed at block 314 or 320, respectively, failed or were otherwise unsuccessful based on whether the syndrome/syndrome weight of the final codeword candidate generated via the LDPC soft decoding operation 700 or 900 is zero (indicating a successful LDPC soft decoding operation) or not (indicating an unsuccessful LDPC soft decoding operation), as described in detail above. If, at decision block 322, it is determined that the error correction soft decoding operation has not failed, the method 300 proceeds to block 324 where error correction operations end.

Figure 10:
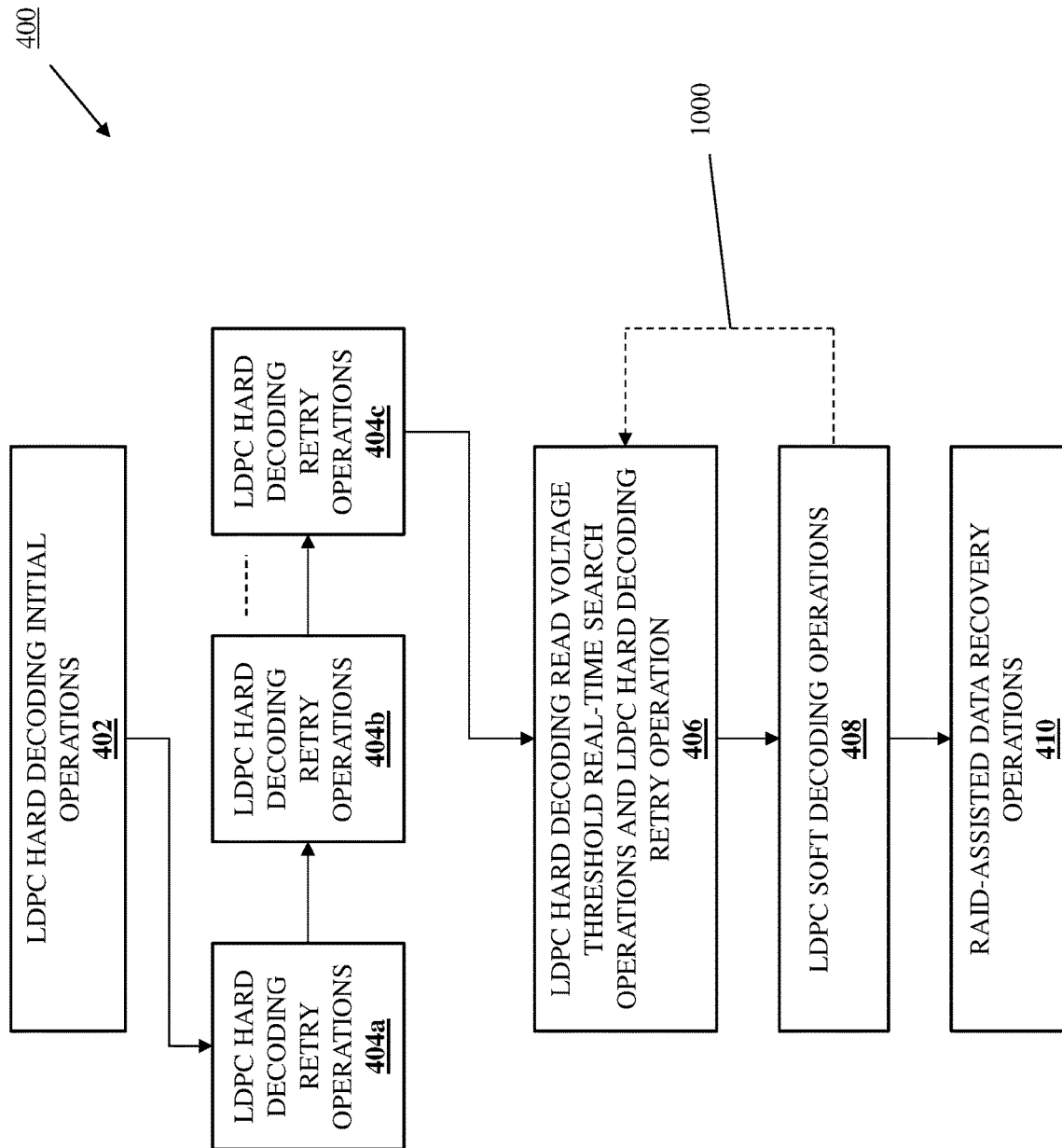
FIG. 10 is a flow chart illustrating an embodiment of modifications to the performance of the conventional storage device error correction stages of FIG. 4 during the method of FIGS. 3A-3E.

If at decision block 322, it is determined that the error correction soft decoding operation has failed, the method 300 proceeds to block 326 where the syndrome-weight-based error correction subsystem performs error correction hard decoding read voltage threshold real-time search operations. As discussed above with regard to the conventional error correction stages 400, the failure of LDPC soft decoding operations at error correction stage 408 is conventionally followed by the performance of RAID-assisted data recovery operations at error correction stage 410. However, one of skill in the art in possession of the present disclosure will appreciate how the performance of RAID-assisted data recovery operations is relatively costly, as such RAID-assisted data recovery operations degrade other Input/Output (I/O) activities in the storage device 200. As such, from the point of view of the conventional error correction stages 400 and following the failure of LDPC soft decoding operations at error correction stage 408, the method 300 instead "loops back" (as indicated by the dotted line 1000 in FIG. 10) to the performance of LDPC hard decoding read voltage threshold real-time search operations and LDPC hard decoding retry operations at the error correction stage 406 (which one of skill in the art in possession of the present disclosure will appreciate is an error correction stage that is skipped in many of the embodiments of the method 300 up to this point).

Thus, in an embodiment of block 326, the syndrome-weight-based error correction engine 204 in the storage device 200 may perform LDPC hard decoding read voltage threshold real-time search operations that, as discussed above, may include the performance of a real-time search for an "optimal" set of read voltage thresholds, and the performance of LDPC hard decoding retry operations using that "optimal" set of read voltage thresholds. As will be appreciated by one of skill in the art in possession of the present disclosure, the LDPC hard decoding read voltage threshold real-time search operations may be performed following the failure of the LDPC soft decoding operations with the expectation that a truly "optimal" set of read voltage thresholds will further reduce the number of bit errors in the data read from the storage subsystem 206.

Figure 3E:
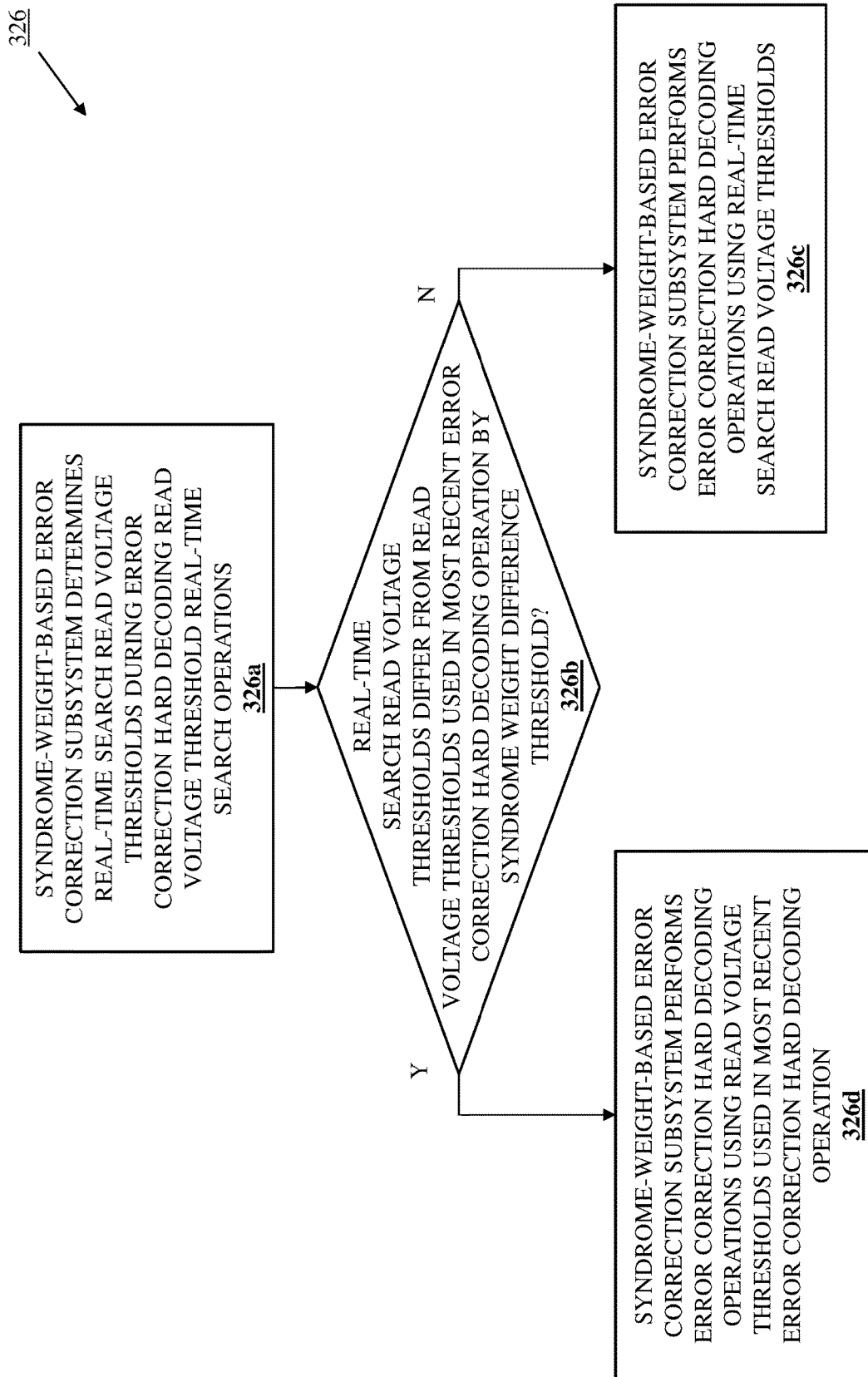
FIG. 3E is a flow chart illustrating an embodiment of a portion of a method for correcting errors in a storage device based on syndrome weights.
Figure 11:
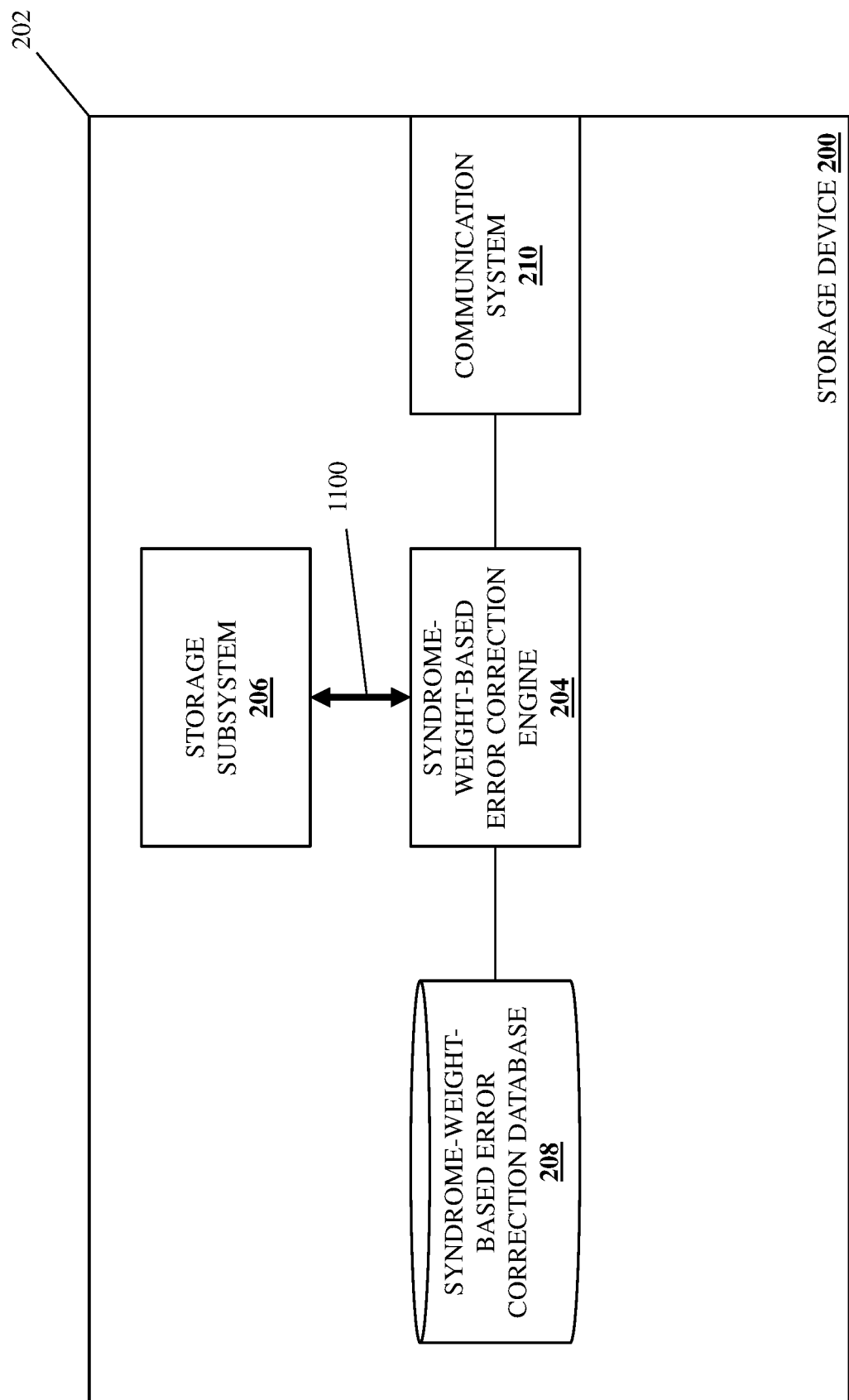
FIG. 11 is a schematic view illustrating an embodiment of the operation of the storage device of FIG. 2 during the method of FIGS. 3A-3E.

For example, with reference to FIG. 3E, block 326 of the method 300 may begin at block 326a where the syndrome-weight-based error correction subsystem determines real-time search read voltage thresholds during error correction hard decoding read voltage read-time search operations. With reference to FIG. 11, in an embodiment of block 326a, the syndrome-weight-based error correction engine 204 in the storage device 200 may perform real-time search read voltage threshold determination operations 1100 that may include performing a real-time search to determine a set of "optimal" read voltage thresholds. As will be appreciated by one of skill in the art in possession of the present disclosure, the "optimal" read voltage threshold for each read window can either be located anywhere between two non-overlapping neighboring states in a cell voltage distribution, or at the intersection between two overlapping neighboring states in a cell voltage distribution (e.g., in a Triple Layer Cell (TCL) NAND storage subsystem that stores 3 bits per cell, there are 8 different states and 7 read windows in the cell voltage distribution).

As such, the real-time search performed at block 326a will attempt to find the "optimal" read voltage threshold for each read window by performing multiple reads to a targeted NAND page using different read voltage thresholds (e.g., starting first with a relatively low read voltage threshold and increasing at fixed increments to a relatively high read voltage threshold), with a difference in the number of 1's or 0's in the data returned from two consecutive reads representing the number of cells in-between the two corresponding read voltage thresholds (i.e., that difference represents an area between two corresponding read voltage thresholds in the cell voltage distribution). Thus, the "optimal" read voltage threshold will lie between the two read voltage thresholds that yield the smallest difference, and the average of those two read voltage thresholds can be taken as the "optimal" read voltage threshold.

Figure 12:
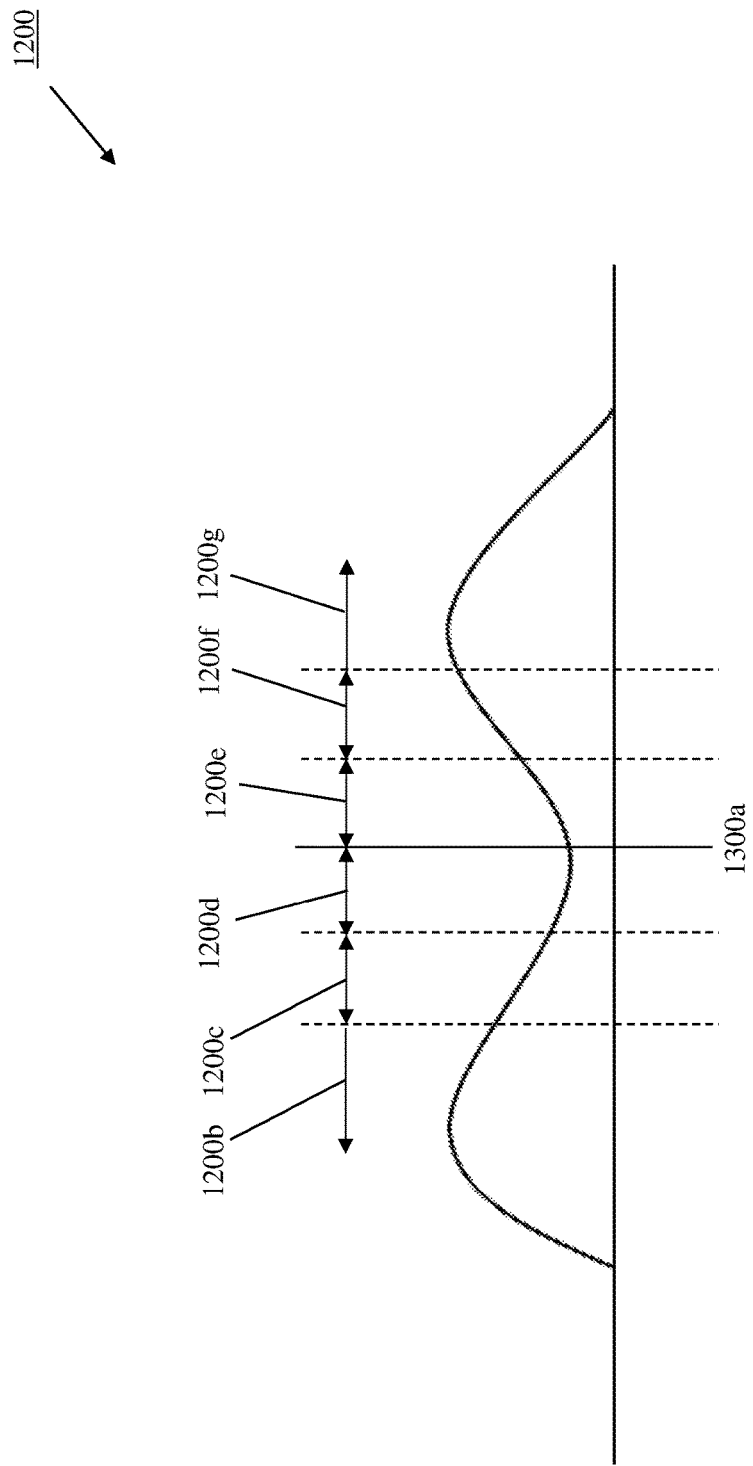
FIG. 12 is a graph view illustrated an embodiment of an optimal read voltage threshold determined for a cell voltage distribution during the method of FIG. 3.

As will be appreciated by one of skill in the art in possession of the present disclosure, for most implementations the read voltage range to scan and the voltage increment for each read window are predetermined to cover common variations in the cell voltage distribution (while limiting the search time). However due to noise in the data that is returned and/or relatively more severe impacts from NAND storage subsystem impairments, the search may not be as accurate for some cell voltage distributions. For example, with reference to FIG. 12, a simplified example of a "normal" cell voltage distribution 1200 is illustrated that one of skill in the art in possession of the present disclosure will recognize provides the voltages in two adjacent cells that are read during the real-time search, with an optimal read voltage threshold 1200a identified along with voltage bins 1200b, 1200c, 1200d, 1200e, 1200f, and 1200g that may be assigned LLR values (e.g., "–7" for voltage bin 1200b, "–4" for voltage bin 1200c, "–1" for voltage bin 1200d, "2" for voltage bin 1200e, "5" for voltage bin 1200f, and "7" for voltage bin 1200g in the illustrated example).

Figure 13:
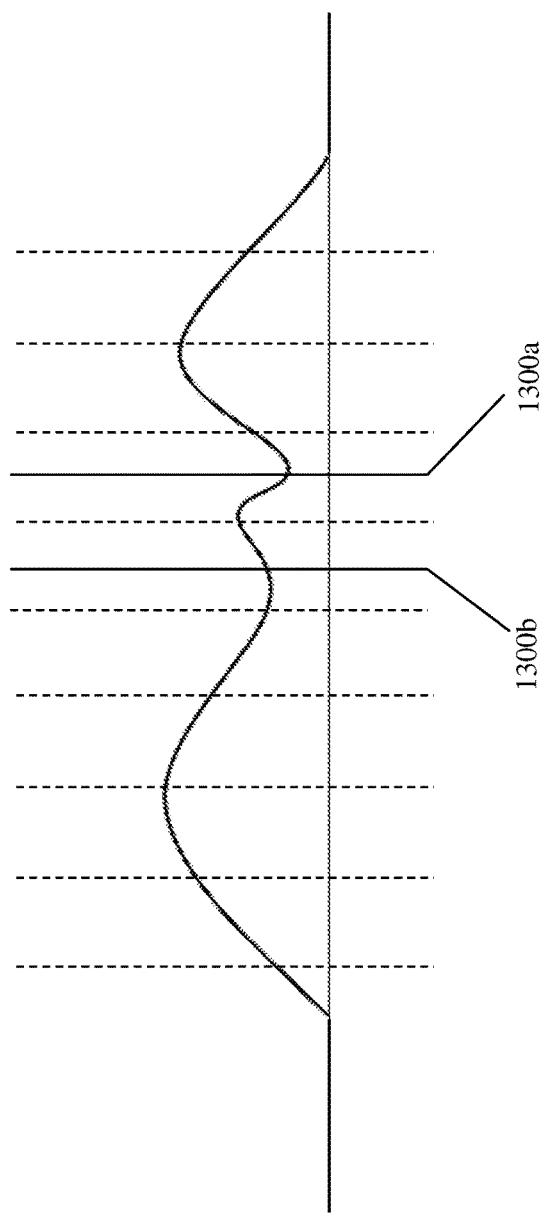
FIG. 13 is a graph view illustrated an embodiment of an optimal read voltage threshold determined for a cell voltage distribution during the method of FIG. 3.

However, with reference to FIG. 13, a simplified example of an "abnormal" cell voltage distribution 1300 is illustrated that one of skill in the art in possession of the present disclosure will recognize provides the voltages in two adjacent cells that are read during the real-time search, but with noise or other NAND storage subsystem impairments resulting in a "false optimal" read voltage threshold 1300a being identified rather than a "true optimal" read voltage threshold 1300b. As will be appreciated by one of skill in the art in possession of the present disclosure, if the set of read voltage thresholds returned from the real-time search are not truly "optimal", the LDPC hard decoding operations and LDPC soft decoding operations on the resulting data read from the storage subsystem 206 using those non-optimal read voltage thresholds may fail or otherwise be unsuccessful. One of skill in the art in possession of the present disclosure will appreciate how the LDPC soft decoding operations will only be effective if accurate LLR values can be obtained for the cells that lie in the overlapping region of the two neighboring states, and by conducting the additional reads in the overlapping region surrounding the "optimal" read voltage threshold as discussed above, an LLR value may be assigned to the cells that lie in each voltage bin (as illustrated and described for the cell voltage distribution 1200 in FIG. 12). As such, the accuracy of the real-time search operations in determining the set of "optimal" read voltage thresholds is critical the success of LDPC soft decoding operations.

Block 326 of the method 300 then proceeds to decision block 326b where it is determined whether the real-time search read voltage thresholds differ from the read voltage thresholds used in the most recent error correction hard decoding operation by a syndrome weight difference threshold. In an embodiment, at decision block 326b, the syndrome-weight-based error correction engine 204 in the storage device 200 may compare the set of read voltage thresholds determined from the real-time search at block 326a to the set of read voltage thresholds used in the most recent LDPC hard decoding operation (e.g., the LDPC hard decoding operation that generated the final codeword candidate with the syndrome weight that was below the syndrome weight threshold, or the LDPC hard decoding operation that generated the final codeword candidate with the lowest syndrome weight) by a syndrome weight difference threshold.

As will be appreciated by one of skill in the art in possession of the present disclosure, the syndrome weight difference threshold may be selected such that it is capable of identifying situations like that illustrated and discussed above with reference to FIG. 13 in which the real-time search resulted in "false optimal" read voltage thresholds, and thus any syndrome weight difference threshold that distinguishes "true optimal" read voltage thresholds like that illustrated and discussed above with reference to FIG. 12 from "false optimal" read voltage thresholds like that illustrated and discussed above with reference to FIG. 13 are envisioned as falling within the scope of the present disclosure. As such, one of skill in the art in possession of the present disclosure will appreciate how decision block 326b operates to perform a check on the accuracy of read voltage thresholds returned in the real-time search, and if a previously used set of read voltage thresholds are deemed more accurate than the read voltage thresholds returned in the real-time search, that previously used set of read voltage thresholds may be used in the subsequent LDPC decoding operations in order to, for example, increase the probability that LDPC soft decoding operations will succeed, thus reducing the costly triggering of RAID-assisted data recovery operations that can degrade I/O activities in the storage device 200.

Figure 14:
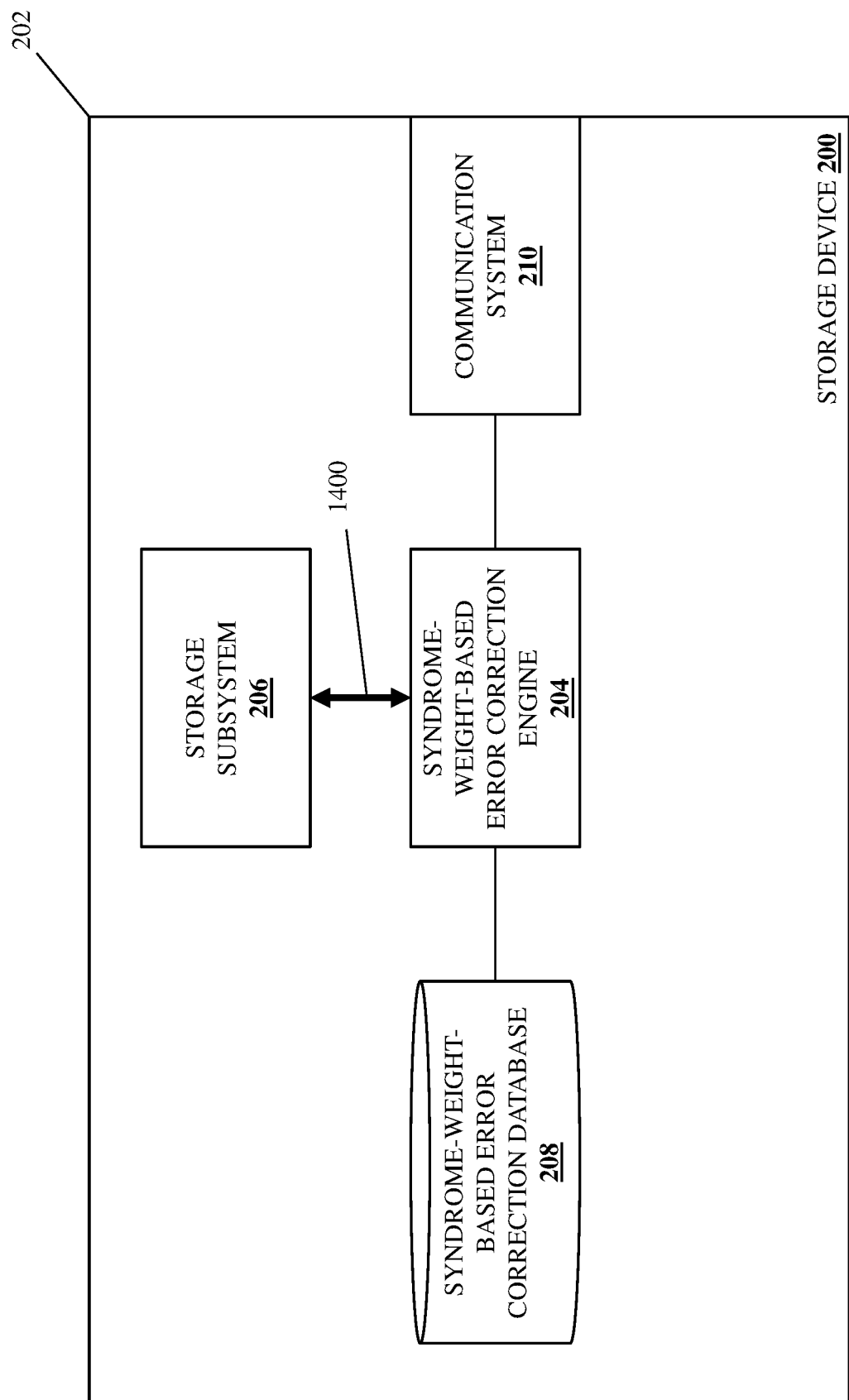
FIG. 14 is a schematic view illustrating an embodiment of the operation of the storage device of FIG. 2 during the method of FIGS. 3A-3E.

If, at decision block 326b, it is determined that the real-time search voltages do not differ from the read voltages used in the most recent error correction hard decoding operation by a syndrome weight different threshold, block 326 of the method 300 proceeds to block 326c where the syndrome-weight-based error correction subsystem performs error correction hard decoding operations using the real-time search read voltage thresholds. With reference to FIG. 14, in an embodiment of block 326c, the syndrome-weight-based error correction engine 204 in the storage device 200 may perform an LDPC hard decoding operation 1400 that includes reading data from the storage subsystem 206 using the "optimal" read voltage thresholds determined during the real-time search.

Figure 15:
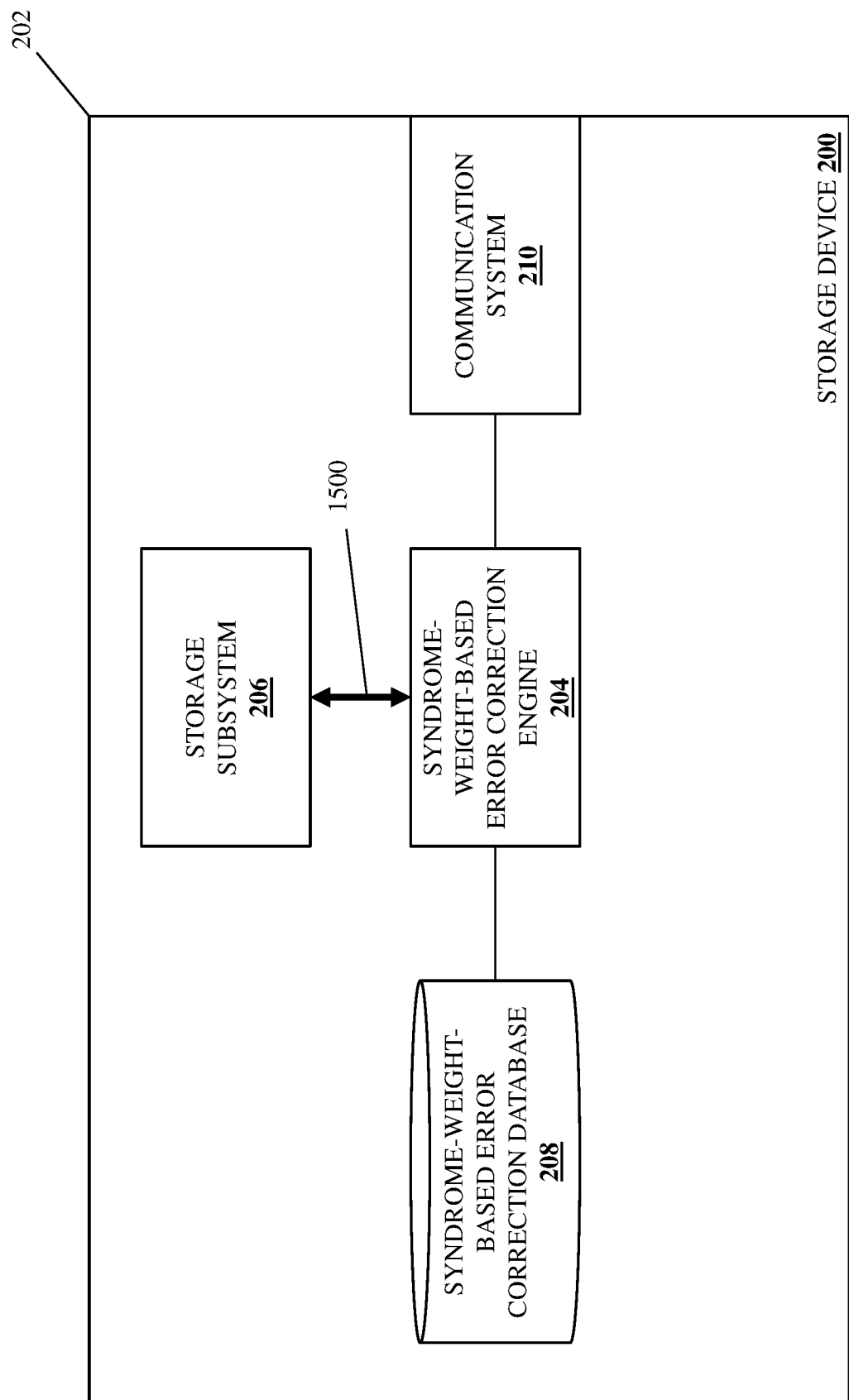
FIG. 15 is a schematic view illustrating an embodiment of the operation of the storage device of FIG. 2 during the method of FIGS. 3A-3E.

If, at decision block 326b, it is determined that the real-time search voltages differ from the read voltages used in the most recent error correction hard decoding operation by a syndrome weight different threshold, block 326 of the method 300 proceeds to block 326d where the syndrome-weight-based error correction subsystem performs error correction hard decoding operations using the read voltage thresholds used in the most recent error correction hard decoding operations. With reference to FIG. 15, in an embodiment of block 326d, the syndrome-weight-based error correction engine 204 in the storage device 200 may perform an LDPC hard decoding operation 1500 that includes reading data from the storage subsystem 206 using the read voltage thresholds used in the most recent LDPC hard decoding operation (e.g., the read voltage thresholds used in the LDPC hard decoding operation that generated the final codeword candidate with the syndrome weight that was below the syndrome weight threshold, or the read voltage thresholds used in the LDPC hard decoding operation that generated the final codeword candidate with the lowest syndrome weight).

With reference back to FIG. 3D, following block 326, the method 300 then proceeds to decision block 328 where it is determined whether error correction hard decoding operations failed or were otherwise unsuccessful. In an embodiment, at decision block 328, the syndrome-weight-based error correction engine 204 in the storage device 200 may determine whether the LDPC hard decoding operation 1400 or 1500 performed at blocks 326c or 326d, respectively, failed or were otherwise unsuccessful based on whether the syndrome/syndrome weight of the final codeword candidate generated via the LDPC hard decoding operation 1400 or 1500 is zero (indicating a successful LDPC hard decoding operation) or not (indicating an unsuccessful LDPC hard decoding operation), as described in detail above. If, at decision block 328, it is determined that the error correction hard decoding operation has not failed or was otherwise successful, the method 300 proceeds to block 330 where error correction operations end.

Figure 16:
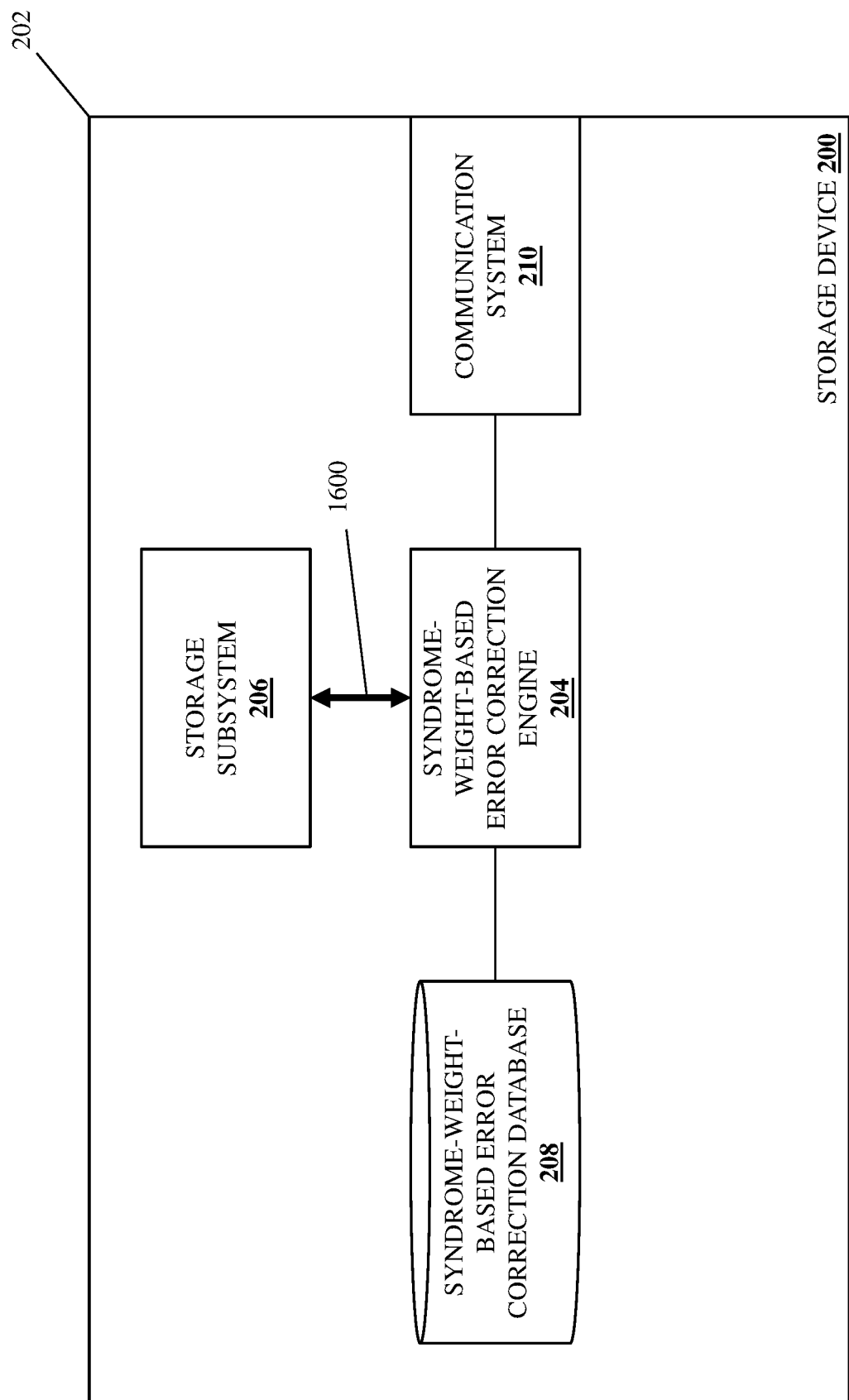
FIG. 16 is a schematic view illustrating an embodiment of the operation of the storage device of FIG. 2 during the method of FIGS. 3A-3E.

If, at decision block 328, it is determined that the error correction hard decoding operation has failed or was otherwise unsuccessful, the method 300 proceeds to block 332 where the syndrome-weight-based error correction subsystem performs error correction soft decoding operations with the read voltage thresholds determined in the error correction hard decoding read voltage threshold real-time search operations. With reference to FIG. 16, in an embodiment of block 332, the syndrome-weight-based error correction engine 204 in the storage device 200 may perform an LDPC soft decoding operation 1600 that includes reading data from the storage subsystem 206 using the "optimal" read voltage thresholds determined during the real-time search.

The method 300 then proceeds to decision block 334 where it is determined whether the error correction soft decoding operation failed or was otherwise unsuccessful. In an embodiment, at decision block 334, the syndrome-weight-based error correction engine 204 in the storage device 200 may determine whether the LDPC soft decoding operation 1600 performed at block 332 failed or was otherwise unsuccessful based on whether the syndrome/syndrome weight of the final codeword candidate generated via the LDPC soft decoding operation 1600 is zero (indicating a successful LDPC soft decoding operation) or not (indicating an unsuccessful LDPC soft decoding operation), as described in detail above.

If, at decision block 334, it is determined that the error correction soft decoding operation has not failed or was otherwise successful, the method 300 proceeds to block 324 where the syndrome-weight-based error correction subsystem performs error correction using the final codeword candidate generated using the error correction soft decoding operation similarly as described above. If at decision block 334, it is determined that the error correction hard decoding operation has failed or was otherwise unsuccessful, the method 300 proceeds to block 336 where the syndrome-weight-based error correction subsystem performs assisted data recovery operations. In an embodiment, at block 336 and as discussed above, the syndrome-weight-based error correction engine 204 in the storage device 200 may generate an uncorrectable read error and perform RAID-assisted data recovery operations using any of a variety of RAID-assisted data recovery techniques that would be apparent to one of skill in the art in possession of the present disclosure.

As such, in some embodiments of the method 300 and in the event the first attempt at LDPC soft decoding operations at block 314 or 320 fails, rather than perform the RAID-assisted data recovery operations at is done at the error recovery stage 410 discussed above with reference to FIG. 4 and in conventional error corrections systems, the LDPC hard decoding read voltage threshold real-time search operations are performed to identify "optimal" read voltage thresholds that are used in LDPC hard decoding retry operations. If those LDPC hard decoding retry operations then fail or are otherwise unsuccessful, the LDCP soft decoding operations may be performed using the "optimal" read voltage thresholds before performing the RAID-assisted data recovery operations. As will be appreciated by one of skill in the art in possession of the present disclosure, while the resulting read latency associated with the sequence of error correction operations in this embodiment is likely longer than simply performing the RAID-assisted data recovery operations immediately following the failure of the first attempt at LDPC soft decoding operations at block 314 or 320, the impact of the sequence of error correction operations in this embodiment to I/O activities on other NAND dies in the storage subsystem 206 is relatively lower (e.g., particularly if successful LDPC hard decoding operations or successful LDPC soft decoding operations eliminate the need to perform the RAID-assisted data recovery operations).

As will be appreciated by one of skill in the art in possession of the present disclosure, the use of the "final" syndrome weights of final codeword candidates generated during LDPC hard decoding operations in the systems and methods of the present disclosure differ from conventional uses of syndrome weights in conventional error correction systems. For example, such conventional error correction systems may perform the LDPC hard decoding read voltage threshold real-time search operations as part of the error correction stage 406 discussed above with reference to FIG. 4 to determine the "optimal" read voltage thresholds discussed above. The conventional error correction systems may then determine an "initial" syndrome weight using data that is read from the NAND storage subsystem using the "optimal" read voltage thresholds and prior to the performance of the LDPC hard decoding retry operations (i.e., as opposed to the "final" syndrome weights discussed above that are determined following the performance of LDPC hard decoding retry operations).

In the conventional error correction systems discussed above, if the syndrome weight of the initial codeword candidate exceeds a relatively large, predetermined syndrome weight threshold, the number of bit errors in data will be determined to have exceeded the error correction capabilities of both LDPC hard decoding operations and LDPC soft decoding operations, and the LDPC soft decoding operations in the error correction stage 408 discussed above with reference to FIG. 4 will be skipped and the RAID-assisted data recovery operations will be performed as part of the error correction stage 410. Furthermore, such conventional uses of syndrome weights in conventional error correction systems may be extended to the LDPC hard decoding initial operations and retry operations performed at error correction stages 402 and/or 404a-404c (e.g., LDPC hard decoding operations/subsequent error correction stages may be skipped if the syndrome weight of an initial codeword candidate generated prior to performing LDPC hard decoding operations in the current error correction stage exceeds a relatively large, predetermined syndrome weight threshold).

As such, one of skill in the art in possession of the present disclosure will appreciate how the use of the syndrome weights of final codeword candidates generated during LDPC hard decoding operations in the systems and methods of the present disclosure differ from conventional uses of initial syndrome weights in conventional error correction systems in that such conventional error correction systems use initial syndrome weights to trigger the skipping of error correction stages based on those initial syndrome weights exceeding a syndrome weight threshold, while the systems and methods of the present disclosure trigger the skipping of error correction stages based on final syndrome weights of final codeword candidates being below a syndrome weight threshold. However, while a particular distinction between the syndrome-weight-based error correction system of the present disclosure and conventional error correction systems has been described, one of skill in the art in possession of the present disclosure will appreciate how the syndrome-weight-based error correction system of the present disclosure differs from conventional error correction systems in a variety of other manners as well.

Thus, systems and methods have been described that leverage the syndrome weights of final codeword candidates generated during error correction hard decoding operations to skip conventional error correction stages in some situations, and/or verify the accuracy of conventional error correction stages in other situations. For example, the storage device syndrome-weight-based error correction system of the present disclosure may include a syndrome-weight-based error correction subsystem coupled to a storage subsystem in a chassis. The syndrome-weight-based error correction subsystem performs a plurality of respective first error correction hard decoding operations on the storage subsystem that each utilize respective read voltage thresholds and that each generate a respective final codeword candidate having a respective syndrome weight. The syndrome-weight-based error correction subsystem identifies a first syndrome weight of a first final codeword candidate that was generated via the performance of one of the plurality of respective first error correction hard decoding operations that utilized first read voltage thresholds and that is lower than the syndrome weights of the final codeword candidates generated via the performance of the others of the plurality of respective first error correction hard decoding operations, and performs error correction soft decoding operations using the first read voltage thresholds. As such, the time needed to perform error correction in storage devices is reduced.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A storage device syndrome-weight-based error correction system, comprising:
   a chassis;
   a storage subsystem that is housed in the chassis; and
   a syndrome-weight-based error correction subsystem that is included in the chassis and coupled to the storage subsystem, wherein the syndrome-weight-based error correction subsystem is configured to:
      perform, on the storage subsystem, a first error correction hard decoding operation that utilizes first read voltage thresholds and that generates a first final codeword candidate having a first syndrome weight;
      perform error correction hard decoding read voltage threshold real-time search operations to determine second read voltage thresholds;
      perform, on the storage subsystem, a second error correction hard decoding operation that utilizes the second read voltage thresholds and that generates a second final codeword candidate having a second syndrome weight;
      determine that the first syndrome weight is less than the second syndrome weight; and
      perform, on the storage subsystem in response to determining that the first syndrome weight is less than the second syndrome weight, error correction soft decoding operations using the first read voltage thresholds.

2. The system of claim 1, wherein the syndrome-weight-based error correction subsystem is configured to:
   perform, on the storage subsystem prior to performing the error correction hard decoding read voltage threshold real-time search operations, a plurality of third error correction hard decoding operations that each utilize respective read voltage thresholds and that each generate a respective third final codeword candidate having a respective third syndrome weight;
   determine that the first syndrome weight of the first final codeword candidate is less than each of the third syndrome weights of the third final codeword candidates and, in response, determine that the first syndrome weight is less than the second syndrome weight.

3. The system of claim 1, wherein the storage subsystem is a NAND storage subsystem.

4. The system of claim 1, wherein the syndrome-weight-based error correction subsystem is configured to:

determine that the error correction soft decoding operations have failed and, in response, perform assisted data recovery operations.

5. The system of claim 1, wherein the first error correction hard decoding operation is a Low-Density Parity Check (LDPC) hard decoding read operation.

6. The system of claim 1, wherein the error correction soft decoding operations are Low-Density Parity Check (LDPC) soft decoding read operation.

7. An Information Handling System (IHS), comprising:
a processing system; and
a memory system that is coupled to the processing system and that includes instructions that, when executed by the processing system, cause the processing system to provide a syndrome-weight-based error correction engine that is configured to:
perform, on a storage subsystem, a first error correction hard decoding operation that utilizes first read voltage thresholds and that generates a first final codeword candidate having a first syndrome weight;
perform error correction hard decoding read voltage threshold real-time search operations to determine second read voltage thresholds;
perform, on the storage subsystem, a second error correction hard decoding operation that utilizes the second read voltage thresholds and that generates a second final codeword candidate having a second syndrome weight;
determine that the first syndrome weight is less than the second syndrome weight; and
perform, on the storage subsystem in response to determining that the first syndrome weight is less than the second syndrome weight, error correction soft decoding operations using the first read voltage thresholds.

8. The IHS of claim 7, wherein the syndrome-weight-based error correction engine is configured to:
perform, on the storage subsystem prior to performing the error correction hard decoding read voltage threshold real-time search operations, a plurality of third error correction hard decoding operations that each utilize respective thread read voltage thresholds and that each generate a respective third final codeword candidate having a respective third syndrome weight;
determine that the first syndrome weight of the first final codeword candidate is less than each of the third syndrome weights of the third final codeword candidates and, in response, determine that the first syndrome weight is less than the second syndrome weight.

9. The IHS of claim 7, wherein the storage subsystem is a NAND storage subsystem.

10. The IHS of claim 7, wherein the determining that the first syndrome weight is less than the second syndrome weight identifies that the second read voltage thresholds are not as accurate as the first read voltage thresholds.

11. The IHS of claim 7, wherein the syndrome-weight-based error correction engine is configured to:
determine that the error correction soft decoding operations have failed and, in response, perform assisted data recovery operations.

12. The IHS of claim 7, wherein the first error correction hard decoding operation is a Low-Density Parity Check (LDPC) hard decoding read operation.

13. The IHS of claim 7, wherein the error correction soft decoding operations are Low-Density Parity Check (LDPC) soft decoding read operation.

14. A method for correcting errors in a storage device based on syndrome weights, comprising:
performing, by a syndrome-weight-based error correction subsystem on a storage subsystem, a first error correction hard decoding operation that utilizes first read voltage thresholds and that generates a first final codeword candidate having a first syndrome weight;
performing, by the syndrome-weight-based error correction subsystem, error correction hard decoding read voltage threshold real-time search operations to determine second read voltage thresholds;
performing, by the syndrome-weight-based error correction subsystem on the storage subsystem, a second error correction hard decoding operation that utilizes the second read voltage thresholds and that generates a second final codeword candidate having a second syndrome weight;
determining, by the syndrome-weight-based error correction subsystem, that the first syndrome weight is less than the second syndrome weight; and
performing, by the syndrome-weight-based error correction subsystem on the storage subsystem in response to determining that the first syndrome weight is less than the second syndrome weight, error correction soft decoding operations using the first read voltage thresholds.

15. The method of claim 14, further comprising:
performing, by the syndrome-weight-based error correction subsystem on the storage subsystem prior to performing the error correction hard decoding read voltage threshold real-time search operations, a plurality of third error correction hard decoding operations that each utilize respective thread read voltage thresholds and that each generate a respective third final codeword candidate having a respective third syndrome weight;
determining, by the syndrome-weight-based error correction subsystem, that the first syndrome weight of the first final codeword candidate is less than each of the third syndrome weights of the third final codeword candidates and, in response, determining that the first syndrome weight is less than the second syndrome weight.

16. The method of claim 15, wherein the storage subsystem is a NAND storage subsystem.

17. The method of claim 14, wherein the determining that the first syndrome weight is less than the second syndrome weight identifies that the second read voltage thresholds are not as accurate as the first read voltage thresholds.

18. The method of claim 14, further comprising:
determining, by the syndrome-weight-based error correction subsystem, that the error correction soft decoding operations have failed and, in response, performing assisted data recovery operations.

19. The method of claim 18, wherein the first error correction hard decoding operation is a Low-Density Parity Check (LDPC) hard decoding read operation.

20. The method of claim 14, wherein the error correction soft decoding operations are Low-Density Parity Check (LDPC) soft decoding read operation.

* * * * *